United States Patent
Buttner et al.

(10) Patent No.: US 11,065,616 B2
(45) Date of Patent: Jul. 20, 2021

(54) METHODS OF MAKING MICROFLUIDIC DEVICES

(71) Applicant: KING ABDULLAH UNIVERSITY OF SCIENCE AND TECHNOLOGY, Thuwal (SA)

(72) Inventors: Ulrich Buttner, Thuwal (SA); Yousof Mashraei, Thuwal (SA); Sumeyra Agambayev, Thuwal (SA); Khaled N. Salama, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 269 days.

(21) Appl. No.: 15/776,872

(22) PCT Filed: Nov. 22, 2016

(86) PCT No.: PCT/IB2016/057046
§ 371 (c)(1),
(2) Date: May 17, 2018

(87) PCT Pub. No.: WO2017/089963
PCT Pub. Date: Jun. 1, 2017

(65) Prior Publication Data
US 2018/0326416 A1    Nov. 15, 2018

Related U.S. Application Data

(60) Provisional application No. 62/258,749, filed on Nov. 23, 2015.

(51) Int. Cl.
*B29C 67/00*     (2017.01)
*B01L 3/00*      (2006.01)
(Continued)

(52) U.S. Cl.
CPC ...... *B01L 3/502707* (2013.01); *B29C 64/135* (2017.08); *B29C 64/35* (2017.08);
(Continued)

(58) Field of Classification Search
CPC ....... B01L 3/502707; B01L 2300/0822; B81C 1/00119; B81C 2201/019; B29C 71/0009; B29C 2071/0027
See application file for complete search history.

(56) References Cited

U.S. PATENT DOCUMENTS 6,287,850 B1 *   9/2001   Besemer ............. B01F 13/0054
                                                    435/283.1
2004/0253545 A1   12/2004  David
(Continued)

OTHER PUBLICATIONS

Amin, R. et al.; "3D-printed microfluidic devices"; Biofabrication 8, Jun. 20, 2016; 16 pages.
(Continued)

*Primary Examiner* — Jacob T Minskey
*Assistant Examiner* — Adrien J Bernard
(74) *Attorney, Agent, or Firm* — Patent Portfolio Builders PLLC

(57) ABSTRACT

Microfluidics has advanced in terms of designs and structures, however, fabrication methods are either time consuming or expensive to produce, in terms of the facilities and equipment needed. A fast and economically viable method is provided to allow, for example, research groups to have access to microfluidic fabrication. Unlike most fabrication methods, a method is provided to fabricate a microfluidic device in one step. In an embodiment, a resolution of 50 micrometers was achieved by using maskless high-resolution digital light projection (MDLP). Bonding and channel fabrication of complex or simple structures can be rapidly incorporated to fabricate the microfluidic devices.

20 Claims, 22 Drawing Sheets

(51) Int. Cl.

| | |
|---|---|
| B81C 1/00 | (2006.01) |
| B81C 3/00 | (2006.01) |
| B29C 71/00 | (2006.01) |
| B33Y 10/00 | (2015.01) |
| B33Y 70/00 | (2020.01) |
| B33Y 80/00 | (2015.01) |
| B29C 64/35 | (2017.01) |
| B29C 64/135 | (2017.01) |
| B29L 31/00 | (2006.01) |

(52) U.S. Cl.
CPC .......... *B29C 67/00* (2013.01); *B29C 71/0009* (2013.01); *B33Y 10/00* (2014.12); *B33Y 70/00* (2014.12); *B33Y 80/00* (2014.12); *B81C 1/00119* (2013.01); *B81C 3/001* (2013.01); *B01L 2300/0816* (2013.01); *B01L 2300/0822* (2013.01); *B01L 2300/168* (2013.01); *B01L 2400/049* (2013.01); *B01L 2400/0487* (2013.01); *B29C 2071/0027* (2013.01); *B29K 2995/0056* (2013.01); *B29L 2031/756* (2013.01); *B81B 2201/051* (2013.01); *B81C 2201/019* (2013.01); *B81C 2201/0188* (2013.01); *B81C 2203/038* (2013.01)

(56) References Cited

U.S. PATENT DOCUMENTS

| | | | | |
|---|---|---|---|---|
| 2009/0169427 | A1* | 7/2009 | Supriya | B01L 3/502707 422/68.1 |
| 2011/0052446 | A1* | 3/2011 | Hirano | C12Q 1/6869 422/68.1 |
| 2012/0282682 | A1* | 11/2012 | Walsh | B01L 3/502707 435/287.2 |
| 2013/0029273 | A1 | 1/2013 | Gao et al. | |
| 2014/0004507 | A1* | 1/2014 | Malic | G01N 21/554 435/6.1 |
| 2015/0097315 | A1* | 4/2015 | DeSimone | B33Y 50/02 264/401 |
| 2015/0202804 | A1* | 7/2015 | Yu | B29C 35/0888 264/496 |

OTHER PUBLICATIONS

Chang, T. L., et al.; "Ultrafast laser ablation of soda-lime glass for fabricating microfluidic pillar array channels"; Microelectric Engineering, 158, Mar. 2016, pp. 95-101.

Liao, S., et al.; "Dynamic Interfacial Printing for Monodisperse Droplets and Polymeric Microparticles"; Advanced Materials Technologies, 1; Mar. 15, 2015; pp. 1-7.

Romoli, L., et al.; "Experimental approach to the laser machining of PMMA substrates for the fabrication of microfluidic devices"; Optics and Lasers in Engineering, 49; Dec. 2010; pp. 419-427.

International Search Report in related International Application No. PCT/IB2016/057046, dated Feb. 8, 2017.

Written Opinion of the International Searching Authority in related International Application No. PCT/IB2016/057046, dated Feb. 8, 2017.

Adams, J.D., et al., "Perspectives on Utilizing Unique Features of Microfluidics Technology for Particle and Cell Sorting," JALA (Charlottesville, VA). Dec. 2009, 14(6):331-40.

Anna, S.L., "Droplets and Bubbles in Microfluidic Devices," Annual Review of Fluid Mechanics. Jan. 2016. vol. 48, pp. 285-309.

Beebe, D.J., et al., "Physics and Applications of Microfluidics in Biology," Annual Review of Biomedical Engineering. Feb. 2002; 4(1): 261-86.

Bhattacharjee, N., et al., "The Upcoming 3D-printing Revolution in Microfluidics," Lap on a Chip. May 2016;8(2):022001.

Buttner, U., et al., "Flash µ-Fluidics: A Rapid Prototyping Method for Fabricating Microfluidic Devices," RSC Advances. Aug. 2016.

Carugo, D., et al., "Facile and Costeffective Production of Microscale PDMS Architectures Using a Combined Micromilling-replica Moulding (µMi-REM) Technique," Biomedical Microdevices. Jan. 2016; 18(1):1-10.

Chao, T-C., et al., "Microfluidic Single-cell Analysis of Intracellular Compounds," Journal of the Royal Society Interface. Aug. 2008. 5(Suppl 2):S139-S50.

Chen, R.J., et al., "Dynamically Controllable Concentration Gradient Generator for Studying Cellular Response to Chemical Instigation," 16th International Solid-State Sensors, Actuators and Microsystems Conference. Jun. 5-9, 2011.

Conchouso, D., et al., "Three-dimensional Parallelization of Microfluidic Droplet Generators for a Litre Per Hour Volume Production of Single Emulsions," Lab on a Chip. Jun. 2014. vol. 14, pp. 3011-3020.

Faustino, V., et al., "Biomedical Microfluidic Devices by Using Low-cost Fabrication Techniques: A Review," Journal of Biomechanics. Nov. 2015.

Guckenberger, D.J., et al., "Micromilling: A Method for Ultra-rapid Prototyping of Plastic Microfluidic Devices," Lab on a Chip. Apr. 2015. vol. 15, pp. 2364-2378.

He, T. et al., "The PDMS-based Microfluidic Channel Fabricated by Synchrotron Radiation Stimulated Etching," Optics Express. Apr. 2010. vol. 18, pp. 9733-9738.

Ho, C.M.B., et al., "3D Printed Microfluidics for Biological Applications," Lab on a Chip. Jul. 2015;15(18):3627-37.

Ho, C-T., et al., "Liver-cell Patterning Lap Chip: Mimicking the Morphology of Liver Lobule Tissue," Lab on a Chip. May 2013, 13(18):3578-87.

Hong, B. et al., "A Concentration Gradient Generator on a Paper-based Microfluidic Chip Coupled with Cell Culture Microarray for High-throughput Drug Screening," Biomedical Microdevices. Feb. 2016; 18(1):1-8.

Keenan, T.M., et al., "Biomolecular Gradients in Cell Culture Systems," Lab on a Chip. Jan. 2008;8(1):34-57.

Krynicki, K., et al., "Pressure and Temperature Dependence of Selfdiffusion in Water," Faraday Discussions of the Chemical Society. Sep. 1978;66(0):199-208.

Kung, P.C., et al., "A Rapid Prototyping and Mass-Production Platform of Microfluidic Devices," Technical Proceedings of the 2007 NSTI Nanotechnology Conference. May 2007. vol. 3, pp. 437-440.

Leech, P.W., et al., "Application of Dry Film Resist in the Fabrication of Microfluidic Chips for Droplet Generation," Journal of Micromechanics and Microengineering. May 2009; 19(6):065019.

Lu, H., et al., "Two-Layer Microstructures Fabricated by One-Step Anisotropic Wet Etching of Si in KOH Solution," Micromachines. Jan. 2016; 7(2):19.

Makamba, H., et al., "Surface Modification of Poly(Dimethylsiloxane) Microchannels," Electrophoresis. Nov. 2003;24(21):3607-19.

Mashraei, S., et al., "Integration of Fractal Biosensor in a Digital Microfluidic Platform," 2015 IEEE Sensors. Nov. 2015. pp. 1-4.

Nithya, M., et al., "A Diffusion Based Long-range and Steady Chemical Gradient Generator on a Microfluidic Device for Studying Bacterial Chemotaxis," Journal of Micromechanics and Microengineering. Feb. 2016;26(3):035011.

Parekh, D.P., et al., "3D Printing of Liquid Metals as Fugitive Inks for Fabrication of 3D Microfluidic Channels," Lab on a Chip. May 2016; 16(0):1812-20.

Reza, A., et al., "The Upcoming 3D-printing revolution in Microfluidics," Lab on a Chip. Jun. 2016;16(10):1720-42.

Sackmann, E.K., et al., "The Present and Future Role of Microfluidics in Biomedical Research," Nature, vol. 507, pp. 181-189. Mar. 2014.

Shallan, A.L., et al., "Cost-Effective Three-Dimensional Printing of Visibly Transparent Microchips within Minutes," Analytical Chemistry. Feb. 2014;86(6):3124-30.

Sharma, H., et al., "Unconventional Low-cost Fabrication and Patterning Techniques for Point of Care Diagnostics," Annals of Biomedical Engineering. Apr. 2011;4(12):1-17.

Sivashankar, S., et al., "A 'Twisted' Microfluidic Mixer Suitable for a Wide Range of Flow Rate Applications," Biomicrofluidics. Jun. 2016; 10(3):034120.

(56) References Cited

OTHER PUBLICATIONS

Sivashankar, S., et al., "Characterization of Solid UV Curable 3D Printer Resins for Biological Applications," IEEE Nano Electro Mechanical Systems (NEMS). Apr. 2016.
Sivashankar, S., et al., "Compatibility Analysis of 3D Printer Resin for Biological Applications," Micro & Nano Letters. Oct. 2016. vol. 11, pp. 654-659.
Sivashankar, S., et al., "Emulated Circulatory System Integrated with Lobule-mimetic Liver to Enhance the Liver Function," IEEE 25th International Conference on Micro Electro Mechanical Systems (MEMS). Jan. 2012-Feb. 2012.
Sivashankar, S., et al., "Flexible Low-cost Cardiovascular Risk Marker Biosensor for Point-of-care Applications," Electronics Letters. Oct. 2015.
Somaweera, H., et al., "A review of Chemical Gradient Systems for Cell Analysis," Analytica Chimica Acta. Feb. 2016;907:7-17.
Taylor, J.M., et al., "Soft Surfaces for the Reversible Control of Thin-Film Microstructure and Optical Reflectance," Advanced Materials. Jan. 2016.
Toepke, M.W., et al., "PDMS Absorption of Small Molecules and Consequences in Microfluidic Applications," Lab on a Chip. Dec. 2006;6(12):1484-6.
Watanabe, M., et al., "Microfluidic Devices Easily Created Using an Office Inkjet Printer," Microfluidics and Nanofluidics. Mar. 2010. vol. 8, pp. 403-408.
Wood, M.A., et al., "Collodial Lithography and Current Fabrication Techniques Producing In-plane Nanotopography for Biological Applications," Journal of the Royal Society Interface. Feb. 2007;4(12):1-17.
Wu, F., et al., "Nanofabricated Structures and Microfluidic Devices for Bacteria: from Techniques to Biology," Chemical Society Reviews. Jan. 2016; 45(2):268-80.
Xia, H., et al., "Chaotic Micromixers Using Two-layer Crossing Channels to Exhibit Fast Mixing at Low Reynolds Numbers," Lab on a Chip. May 2005;5(7):748-55.
Xia, Y., et al., "Fabrication Techniques for Microfluidic Paper-based Analytical Devices and Their Applications for Biological Testing: A Review," Biosensors and Bioelectronics, Mar. 2016. vol. 77, pp. 774-789.
Yazdi A.A., et al., "3D Printing: An Emerging Tool for Novel Microfluidics and Lab-on-a-chip Applications," Microfluidics and Nanofluidics. Feb. 2016; 20(3):1-18.
Yoon No, D., et al., "3D Liver Models on a Microplatform: Well-defined Culture, Engineering of Liver Tissue and Liver-on-a-chip," Liver on a Chip. Jul. 2015, 15(19):3822-37.
Zhang, H., et al., "Microfluidic Gradient Device for Studying Mesothelial Cell Migration and the Effect of Chronic Carbon Nanotube Exposure," Journal of Micromechanics and Microengineering : Structures, Devices, and Systems. Jun. 2015;25(7):075010.
Zhou, M., et al., "Experimental Study on the Replication Quality of Micro-nano Cross-shaped Structure Arrays in Injection Molding," Jan. 2016:1-7.

\* cited by examiner

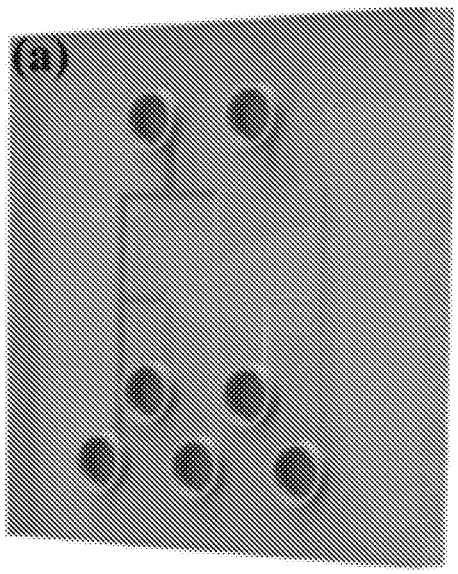 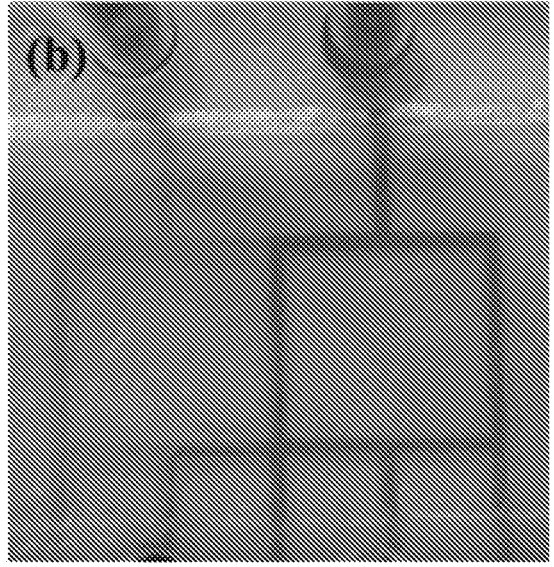
FIG. 13A          FIG. 13B
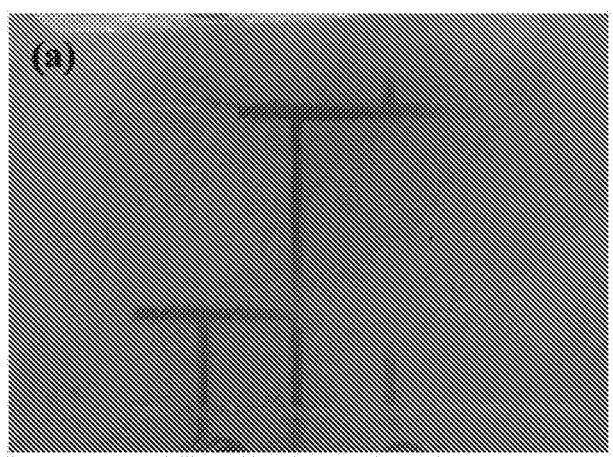 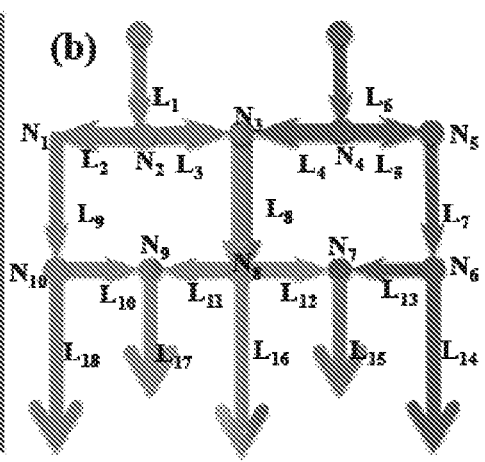
FIG. 14A          FIG. 14B

METHODS OF MAKING MICROFLUIDIC DEVICES

CROSS-REFERENCE TO RELATED APPLICATIONS

This application is a U.S. National Stage Application of International Application No. PCT/IB2016/057046, filed on Nov. 22, 2016, which claims the benefit of and priority to U.S. Provisional Application Ser. No. 62/258,749, having the title "METHODS OF MAKING MICROFLUIDIC DEVICES," filed on Nov. 23, 2015, the disclosures of which are incorporated herein by reference in their entirety.

TECHNICAL FIELD

The present disclosure generally relates to the fabrication of microfluidic channels.

BACKGROUND

Microfluidic devices are expected to be one of the key tools for researchers working in the biomedical field (1). This is due to the acquired features of microfluidic devices such as precisely patterned channels for flow in <1 mm, mass production of disposable and inexpensive devices, the requirement of small amounts of reagents and analytes and dominance of laminar flow i.e. molecules transported in a predictable manner (2). Microfluidic platform mimics organs and their functions (3-6). They can thereby reduce the cost and process of clinical trials. Hence, biologists prefer microfluidic systems to the conventional laboratory equipment and process. Biomedical applications mostly prefer multi-functions to be performed on a single platform called micro total analysis systems or lab-on-chip systems. This is mainly because these devices have the ability to: (a) reduce the reagent cost and sample volume; (b) provide cell microenvironment by manipulating fluids within the channels; (c) streamline complex assays; and (d) be scalable and screen multiple samples. This emphasizes there is a large demand for the microfluidic systems.

Traditional microfabrication methods like thin film deposition (9), etching (10), anodic bonding (8) soft lithography (11), embossing and micro-machining (12), laser ablation (13), laser writing and thermal bonding (14), dry-film photoresist (15) and in situ construction injection molding (16, 17) are used for large-scale replication and production. The advanced fabrication techniques such as soft lithography (18, 19), 3D printed-paper based microfluidics (20, 21) and MEMS lithography fabrication techniques usually take hours to fabricate a device and are quite expensive. Recently 3D printed (22), dynamic interfacial printed (23) microfluidics and their biomedical applications have been developing rapidly (20, 24). The time needed for fabrication via 3D printing is greatly reduced (25) because the process requires just one machine and, being fully automated, it can be easily replicated. Although 3D printing has been developing rapidly, microfluidic developers avoid the adoption of 3D printing due to certain barriers on resolution, throughput, and resin biocompatibility (26).

Photolithography is also a process sometimes used to make microfluidic devices or channels (7, 8). Photolithography, also called optical lithography or UV lithography, is a process that can be used in microfabrication to pattern parts of a thin film or the bulk of a substrate. It uses light to transfer a geometric pattern from a photomask to a light-sensitive chemical typically referred to as "photoresist", or simply "resist" placed on an inner substrate. A series of chemical treatments is then used to engrave the exposure pattern into, or enable deposition of a new material in the desired pattern, upon the substrate.

In a typical photolithography process a substrate, sometimes called a wafer, is provided. The wafer is cleaned to remove organic and inorganic contaminants and dried, typically by heating. An adhesion promotor may then be applied to the surface of the wafer to promote adhesion of the photoresist to the surface of the wafer. The photoresist is then applied to the surface of the wafer, typically by spin coating during which a viscous, liquid solution of photoresist is deposited onto the wafer, and the wafer is spun rapidly to produce a uniformly thick layer of photoresist on the surface of the wafer. The photoresist coated wafer may then be prebaked to drive off excess photoresist solvent. After pre-baking, the photoresist is exposed to a pattern of intense light, the exposure to light causing a chemical change in the photoresist. Undesired photoresist may be removed by application of special solution called "developer" or by an ablation process, such as laser etching. Ultimately the product after removal of the undesired photoresist may then be hard-baked to solidify the remaining photoresist.

To date, although microfabrication technologies for fabricating a microfluidic device are advanced, they are still time-consuming and laborious. As can be seen photolithography, in particular, is an involved, time consuming process, and an expensive process. It is not a particularly convenient process for use in making microfluidic devices or channels, particularly as needed in a laboratory setting.

Accordingly, there is a need to address the aforementioned deficiencies and inadequacies.

SUMMARY

The present disclosure provides methods for in situ fabrication of microfluidic devices. We provide a non-traditional method of fabricating microfluidic devices. In various aspects the microfluidic devices can be fabricated in one exposure. In various aspects the fabrication of the present microfluidic devices is based on stereolithography. The fabrication of the present microfluidic devices can be fast and easy using a maskless UV projection method. In various aspects the method can take less than 5 minutes. In various aspects, the fabrication method is robust and inexpensive. It can use a photocurable resin and a light projector for curing the resin. The light projector can be a projector of UV light. For example, the projector of UV light can be a digital light projector (DLP) or a cell phone screen.

In one or more embodiments, the microfluidic devices are formed between two surfaces or substrates in a light sensitive material. Examples of light sensitive, or photo curable, materials that can be used include photo curable polymers and resins, such as Poly(methyl methacrylate)(PMMA), Poly(methyl glutarimide)(PMG1), Phenol formaldehyde resin (DNQ/Novolac), and photo-reactive epoxy-based polymers (such as SU-8 photoresist). In one or more aspects, the surfaces are inert with respect to the light sensitive material. For example, at least one of the surfaces can be an inert material transparent to light such as a sheet of glass (e.g., a glass slide), a PMMA or a polyethylene teraphthalate (PET). The channels can be fabricated within 2-20 seconds. A digital light projector (DLP) can be used as a maskless lithography system. At a specific distance the projected light from the DLP can be focused on at least one of the surfaces or substrates that is transparent to light. The light can solidify (cure) selected sections or portions of the light sensitive material between the two surfaces to form the microfluidic channels.

Thus, fabrication of a lab on a chip final product can be done in just a few steps. In a first step the pattern for the desired device can be drawn, for example, using software. In a second step, the desired device is assembled by providing the substrates for the device, forming inlet and outlet ports in the substrates and placing the desired amount of a photocurable resin between the substrates. In a third step the photocurable resin is exposed to a light source, for example a UV source, to cure selected portions of the photocurable resin drawn in Step 1 and if needed alignment or pre-alignment of the substrates. Thereafter, in a fourth step the assembled device is flushed to remove uncured resin. The soluble or uncured resin can be removed using suction or vacuum, followed by flushing with a solvent for the resin, such as isopropyl alcohol (IPA), ethanol, methanol alcohol or chloroform, to remove any remaining undesired light sensitive or curable material in the post fabrication stage.

The resolution of this system can be in the range of a few microns to tens of mm. As a non-limiting example, the resolution can be 50 micrometers, which is sufficient for fabrication of most microfluidics devices. For example, a resolution of 50 micrometers was achieved by using a high-resolution digital light projector. In an aspect, we can rapidly incorporate bonding and channel fabrication of complex or simple structures.

In an embodiment a method is provided for fabrication of microfluidic channels comprising the steps of; a) providing a pair of surfaces, at least one of the surfaces formed of a light transmissive material; b) depositing a light sensitive material between the surfaces; c) providing a programmable light source; d) positioning the pair of surfaces including the light sensitive material there between in relation to the programmable light source to receive light projected therefrom; e) using the programmable light source to project light through the surface formed of a light transmissive material and to expose selected areas of the light sensitive material causing photo initiation of a reaction within the selected areas of the light sensitive material leaving certain undesired portions of the material soft; and f) using pressurized air or vacuum to remove the undesired portions of the light sensitive material to form channels within the light sensitive material.

In any one or more aspects, the light selective material can be selected from the group consisting of photo sensitive resins. The at least one surface formed of a light transmissive material can be selected from the group of quartz, Pyrex, PMMA and other transparent polymers. The pair of surfaces can include a pair of opposed surfaces. The opposed surfaces can be opposed flat surfaces. In an aspect the opposed surfaces can be opposed, parallel flat surfaces. The flat surfaces can each be formed of a glass slide. The surfaces can be disposed apart any distance of from 10 micron to 500 micron and even larger than 800 micron depending on the viscosity of the photo sensitive resin. The light sensitive material can be exposed for a period of 2 seconds to 20 seconds. The pressurized air can be either a positive or a negative air pressure. The method can further include flushing the channels with a solvent. The solvent can be selected from the group consisting of isopropyl alcohol, ethanol, methanol, alcohol, and chloroform.

In various aspects, the microfluidic devices can be miniaturized fluidic droplet generators or gradient generators or times in between.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 13A is an illustration of a gradient generator of the present disclosure.

FIG. 13B is an enlarged view of the microchannel and flow of dyes at 10 µl/min.

FIG. 14A depicts a chemical test to show the resin is inert to chemical reaction. FIG. 14B is a schematic illustration of the gradient generator.

FIG. 15 depict a gradient generated in the chip.

FIG. 16 depict cell viability assays with treated, non-treated surface and drug.

DETAILED DESCRIPTION

Figure 1:
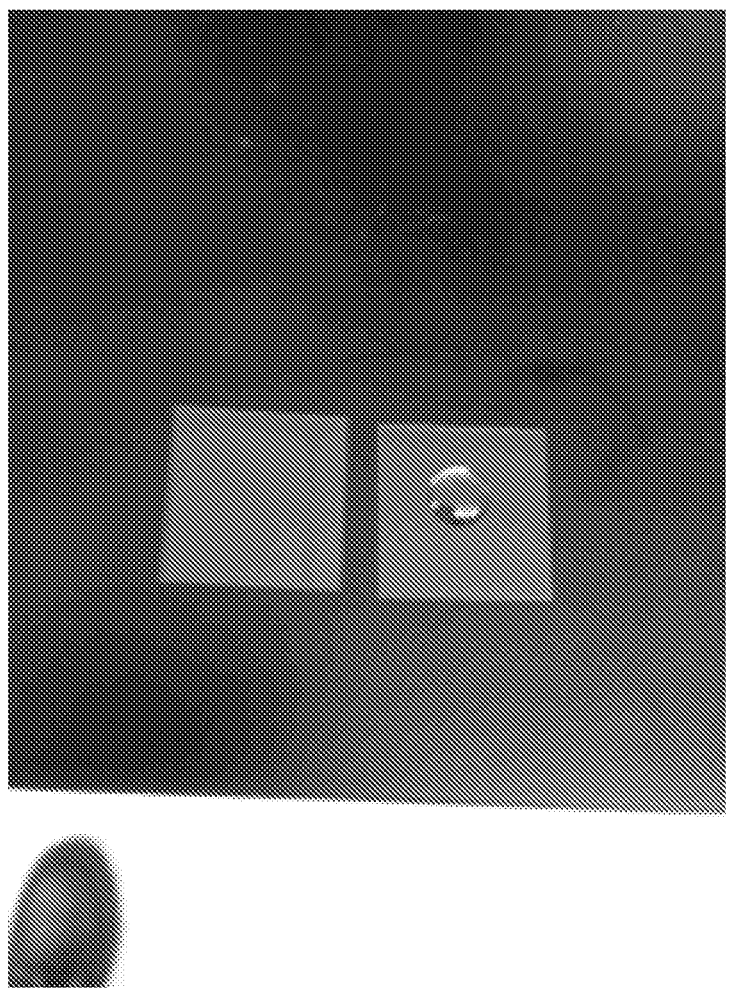
FIG. 1 shows two surfaces for use in fabricating a microfluidic device in an embodiment of the present disclosure, with a light sensitive material placed on one of the surfaces.

Described below are various embodiments of the present systems and methods for making microfluidic devices. Although particular embodiments are described, those embodiments are mere exemplary implementations of the system and method. One skilled in the art will recognize other embodiments are possible. All such embodiments are intended to fall within the scope of this disclosure. Moreover, all references cited herein are intended to be and are hereby incorporated by reference into this disclosure as if fully set forth herein. While the disclosure will now be described in reference to the above drawings, there is no intent to limit it to the embodiment or embodiments disclosed herein. On the contrary, the intent is to cover all alternatives, modifications and equivalents included within the spirit and scope of the disclosure.

Discussion

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, synthetic inorganic chemistry, analytical chemistry, and the like, which are within the skill of the art. Such techniques are explained fully in the literature.

It is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Description

Figure 2:
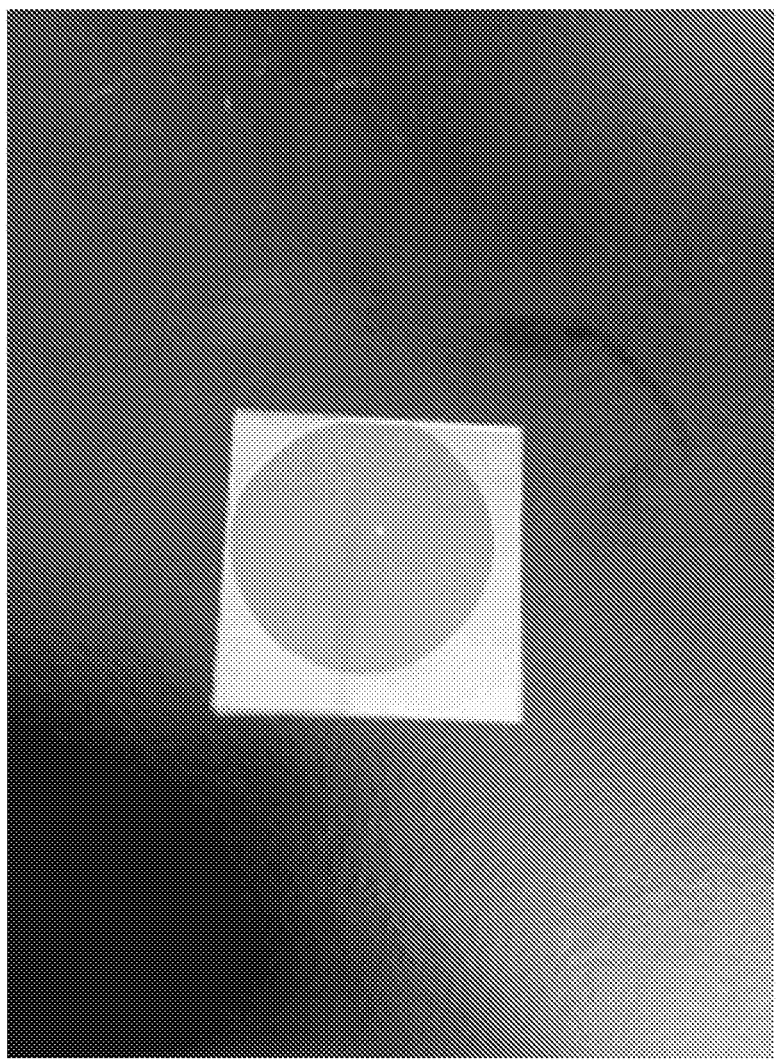
FIG. 2 shows, in an embodiment of the present disclosure, an assembly of a light sensitive material or resin placed between two surfaces, such as a glass cover slides.

We now describe various embodiments of our method for fabrication of microfluidic devices. In various aspects, a surface or substrate is provided on which a light sensitive material, such as photo curable polymer or resin, is disposed, as depicted in FIG. 1. In an aspect the surfaces can be glass cover slides. The surfaces of the slides can first be cleaned with a solvent such as isopropyl alcohol (IPA), The light sensitive material can be covered with the second surface or substrate. The light sensitive material or resin can thus be placed between the surfaces, a bottom (first) substrate and the covering (or second) substrate, as depicted in FIG. 2, forming an assembly of a light sensitive material or resin placed between two surfaces.

The surfaces are preferably comprised of a material that is inert in relation to the light sensitive material. In an aspect, both surfaces can be formed of a glass sheet, for example a glass slide. At least one of the surfaces (the first substrate and the second (covering) substrate) can be transparent or light transmissive to allow light to pass there through for use in curing the light sensitive material. Other materials suitable for use as the surfaces include quartz, Pyrex®, PMMA and transparent polymers. In an aspect, an adhesion promoter can be provided to aid in adhering the light sensitive material to the surfaces. Suitable adhesion promoters include Chloroform, plasma treatment and chemicals which are solvents to such polymers.

The surfaces can be a pair of opposed surfaces. Additional surfaces can be provided to provide additional layers of light sensitive material. The surfaces can be flat surfaces, but need not be flat surfaces. The opposed surfaces can be parallel to each other but need not be parallel to each other.

The light sensitive material can be either a positive or a negative light sensitive material. A positive light sensitive material is a type of light sensitive material in which the portion of the material that is exposed to light becomes soluble to a selected solvent for the material. The portion of the material that is unexposed remains insoluble to a selected solvent for the material. A negative light sensitive material is a type of light sensitive material in which the portion of the material that is exposed to light becomes insoluble to a selected solvent for the material. The unexposed portion of the material can be dissolved by the selected solvent for the material. Light sensitive materials that can be used include photo curable polymers and resins, also called photoresist. Examples of suitable light sensitive materials include, Poly(methyl methacrylate)(PMMA), Poly (methyl glutarimide)(PMG1), Phenol formaldehyde resin (DNQ/Novolac), polyethylene terephthalate (PET) and polystyrene (PS).

Figure 3A:
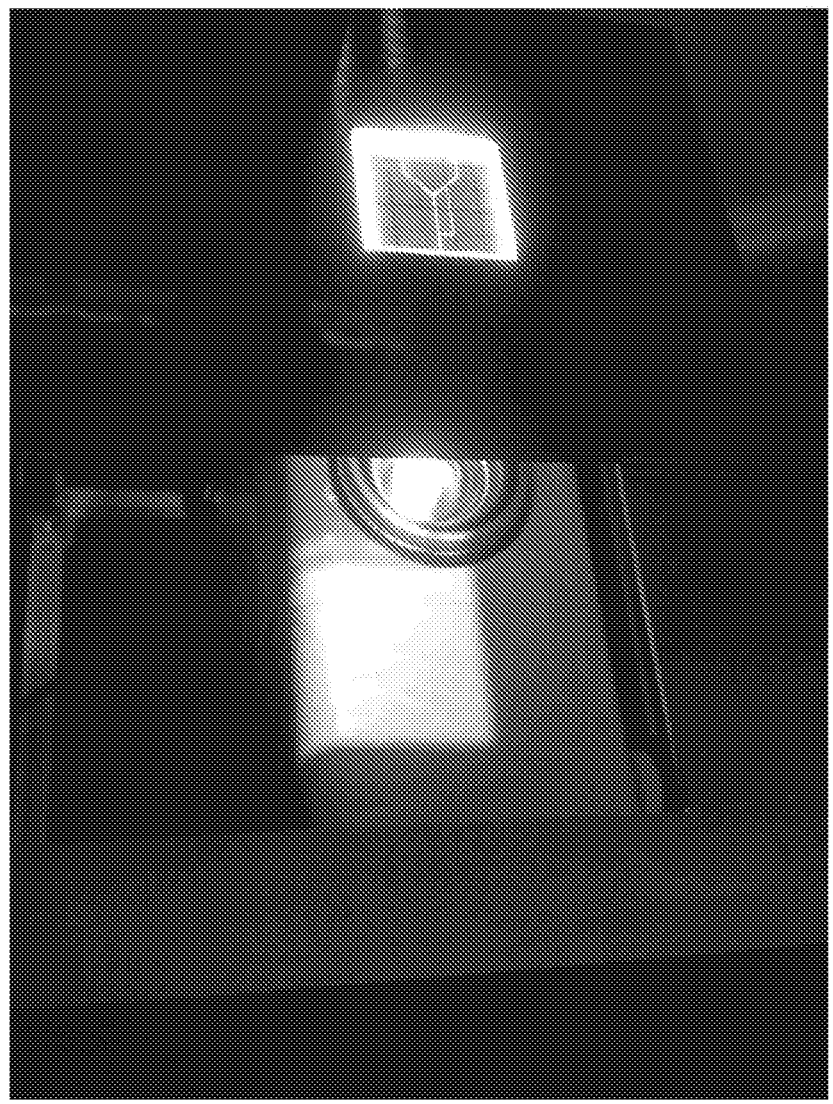
FIG. 3A shows an embodiment of a maskless image projected at selected portions of the light sensitive material of FIG. 2, which is sandwiched between two glass cover slides as the first and second surfaces.
Figure 3B:
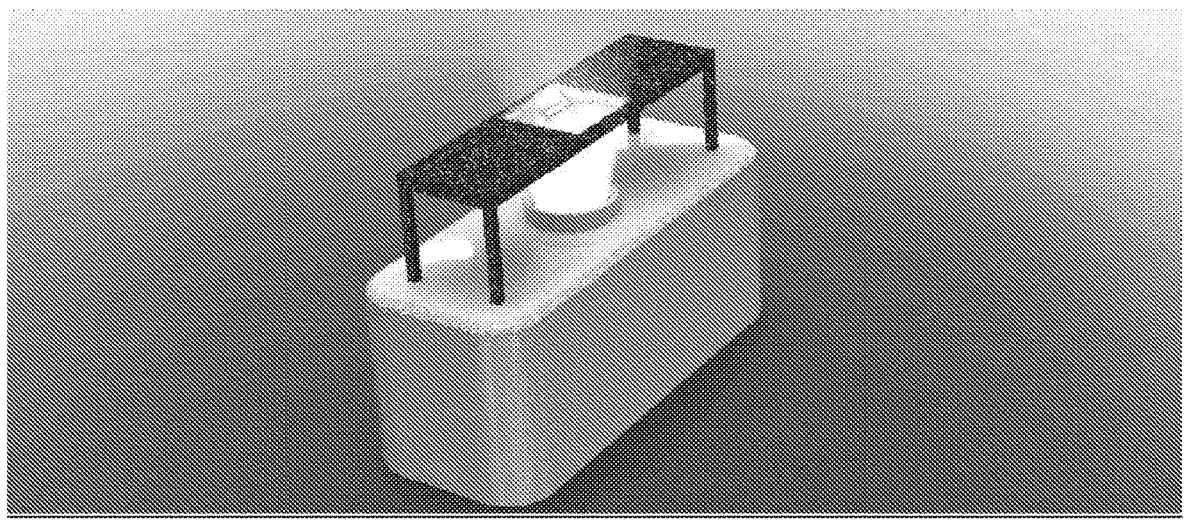
FIG. 3B is a depiction of a glass cover slide holder for holding the assembly of FIG. 2 in relation to a light projector in an embodiment of the present method.

An assembly of the light sensitive material placed between the two surfaces can be positioned in relation to a light source to provide maskless image projection at the light sensitive material, as depicted in FIGS. 3A and 3B. FIG. 3A shows the light source projected as a pattern to expose selected portions of the light sensitive material. FIG. 3B depicts an aspect of the present disclosure wherein a holder, such as a glass cover slide holder, is used to hold the assembly in position in relation to a light projector. A software initiated pattern can be projected and the selected portions of the light sensitive material or resin exposed to the pattern. For example, a digital light processor (DLP) including a programmable processor and a digital micro-mirror device (DMD) can be used. In one or more aspects, the processor can be programmed with programmable logic or software used to select the portions or areas of the light sensitive material to be exposed to light for fabricating microfluidic channel(s) in the material.

The software used to design the channels can be drawn with Windows Paint or Solid-Works. However, other programs such as Windows PowerPoint can also be used. The light sensitive material placed between the surfaces (the first and second substrates) can be exposed to the designed pattern. In one or more aspects the light sensitive material can be exposed via digital light projection (DLP), as per software design, which can result in a 2D structure.

In any one or more aspects, it can be desirable to maintain a constant height or distance across the light sensitive material. The surfaces can be opposed parallel surfaces having a constant spacing or distance there between. A device or devices can be provided to ensure the height (the distance between the surfaces (the first and second substrates)) is kept constant. As an example, double-sided adhesive can be used on two sides of the surfaces (positioned, for example, outside the exposed pattern). In one or more aspects a light sensitive material (for example, a methacrylate photo polymer) can be placed between two glass slides, quartz slides or silicon and glass/quartz. Depending on the tape thickness (i.e., the distance between the slides) the exposure time can be adapted to ensure the complete curing of the selected portions of the light sensitive material.

In various aspects the light sensitive material can be exposed with light from a light source. The light source can be a source of UV light. The light source can be a cell phone display. The light source can be a digital light projector (DLP), The light source can cause photo initiation of a reaction within the selected exposed portions of the light sensitive material (i.e., to "cure" the selected, exposed portions of the material). The curing of the material can result in either a hardening of the selected, exposed portions of the material leaving the unselected, unexposed areas soft (as in the case of a negative light sensitive material) or a softening of the selected, exposed portions of the material (as in the case of a positive light sensitive material). In either case, the undesired, namely the soft or softened areas, of the material can be removed. In one or more aspects, the selected areas of the material can be exposed with light from the projector for 2-20 3-19, 4-18, 5-17, 6-16, 7-15, 8-14, 9-13, or 10-12 seconds. The light, for example, can be a mercury, halogen, or UV light.

After exposure a post treatment step can be used to remove the undesired material to form the one or more channels. For example a source of pressurized air (either positive air pressure, or negative air pressure for example by suction or vacuum) can be used to remove the soft material to form the channel(s) and to form inlet/outlet ports for the channel(s). The open channel(s) can be flushed with a solvent for the material to remove uncured material, for example uncured material remaining alter use of air to remove material. A suitable solvent is isopropyl alcohol (IPA). Other suitable solvents include ethanol, methanol, alcohol, and Chloroform. Ultimately water can be used to stop the etching/cleaning process for fabricating the channel(s).

Figure 4:
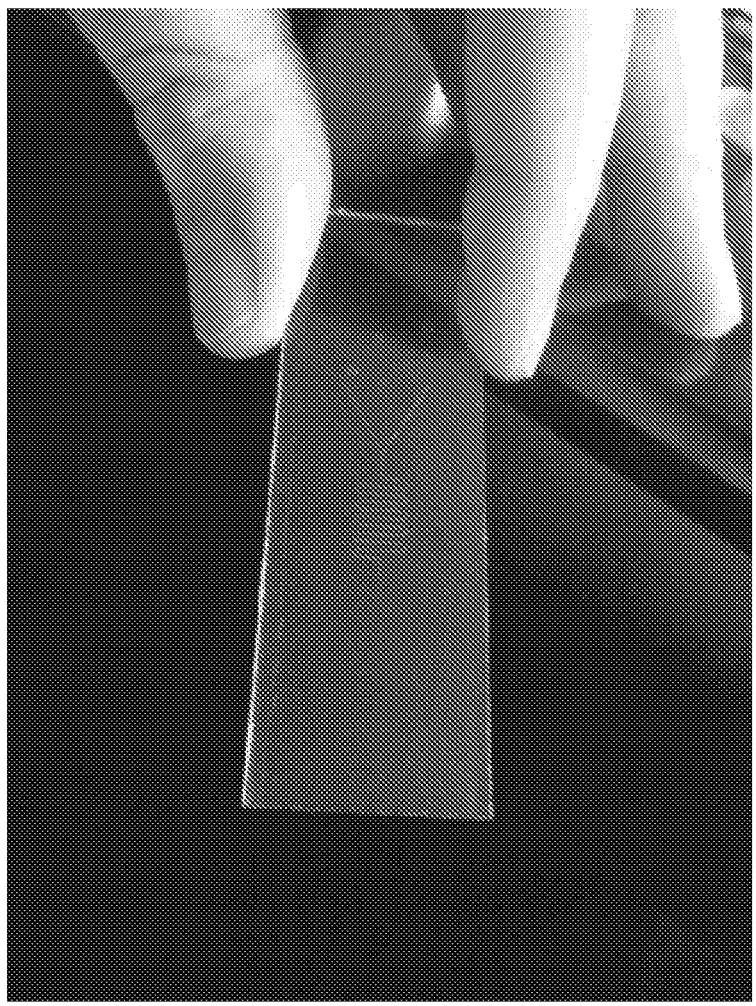
FIG. 4 depicts an exposed assembly of light sensitive material held between two transparent surfaces, for example glass cover slides, resulting in fabrication of a microfluidic channel printed in just 4 seconds in accordance with an embodiment of the present method.
Figure 5:
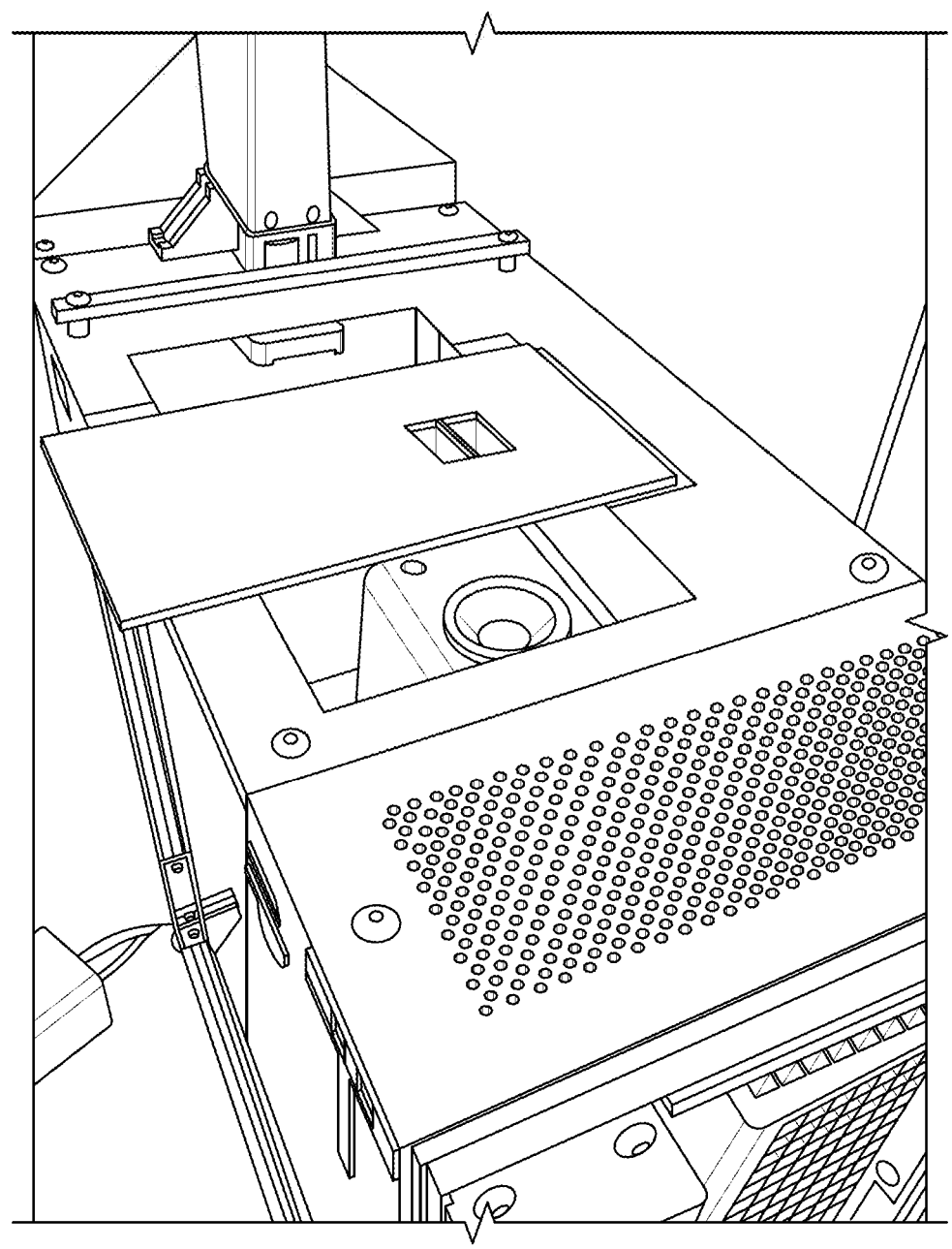
FIG. 5 depicts a setup including an embodiment of a glass cover slide holder for positioning an assembly of a light sensitive material or resin placed between the two surfaces in relation to a light projector in accordance with an embodiment of the present method.
Figure 6:
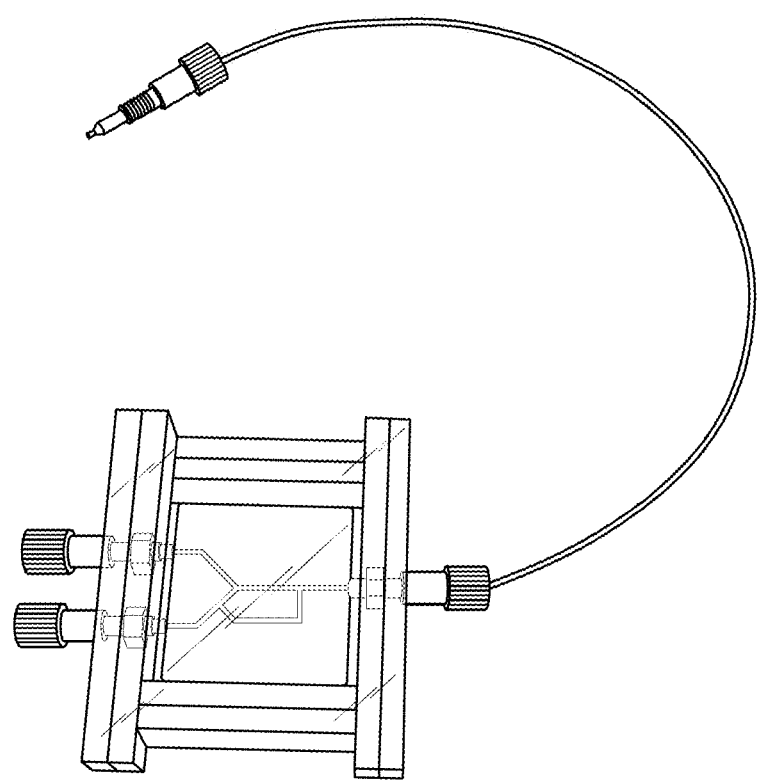
FIG. 6 depicts an embodiment of a holder fabricated to access of microfluidic channels fabricated in accordance with the present, providing inlet and outlet ports to the channels of the device.

FIG. 4 depicts an assembly of light sensitive material or resin placed between two transparent surfaces having been exposed to a pattern of light resulting in fabrication of a microfluidic channel by the above process in just 15 seconds or less, for example 4 seconds. A set up using a digital light projector and a holder to hold the assembly of a light sensitive material or resin between two opposed substrates in relation to the light projector is depicted in FIG. 5. After the microfluidic channel is printed a holder can be fabricated as depicted in FIG. 6. The holder can assist in securing the opposed surfaces (for example, glass plates) about the microfluidic channels and in providing inlet and outlet ports to the channels to provide one or more fluid inlets to one or more fluid channels in the microfluidic device. The holder of FIG. 6 can make it possible to probe the microfluidic device and provide inlet and outlet channels without drilling holes to form the inlet and outlet channels.

Figure 7A:
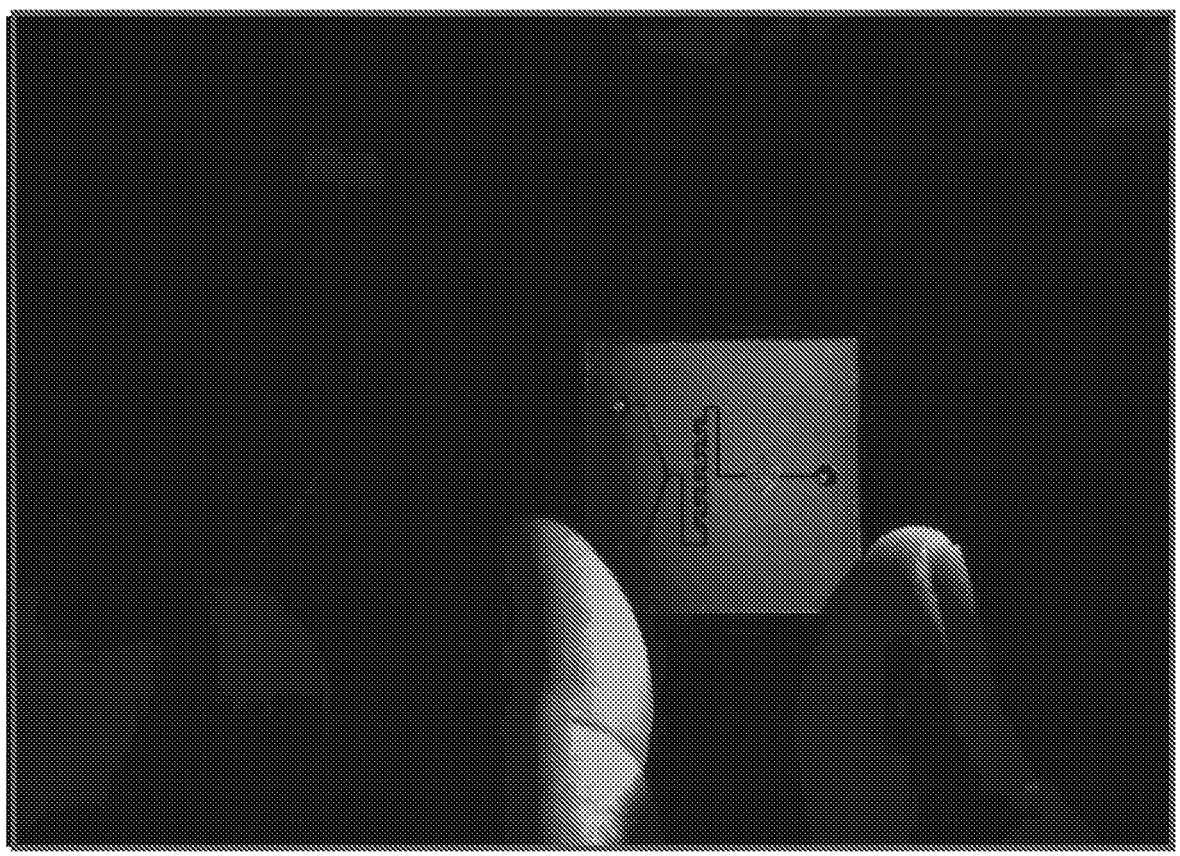
FIGS. 7A and 7B depict another microfluidic device in the form of a microfluidic mixer and agglutination chip fabricated in accordance with an embodiment of the present method.
Figure 7B:
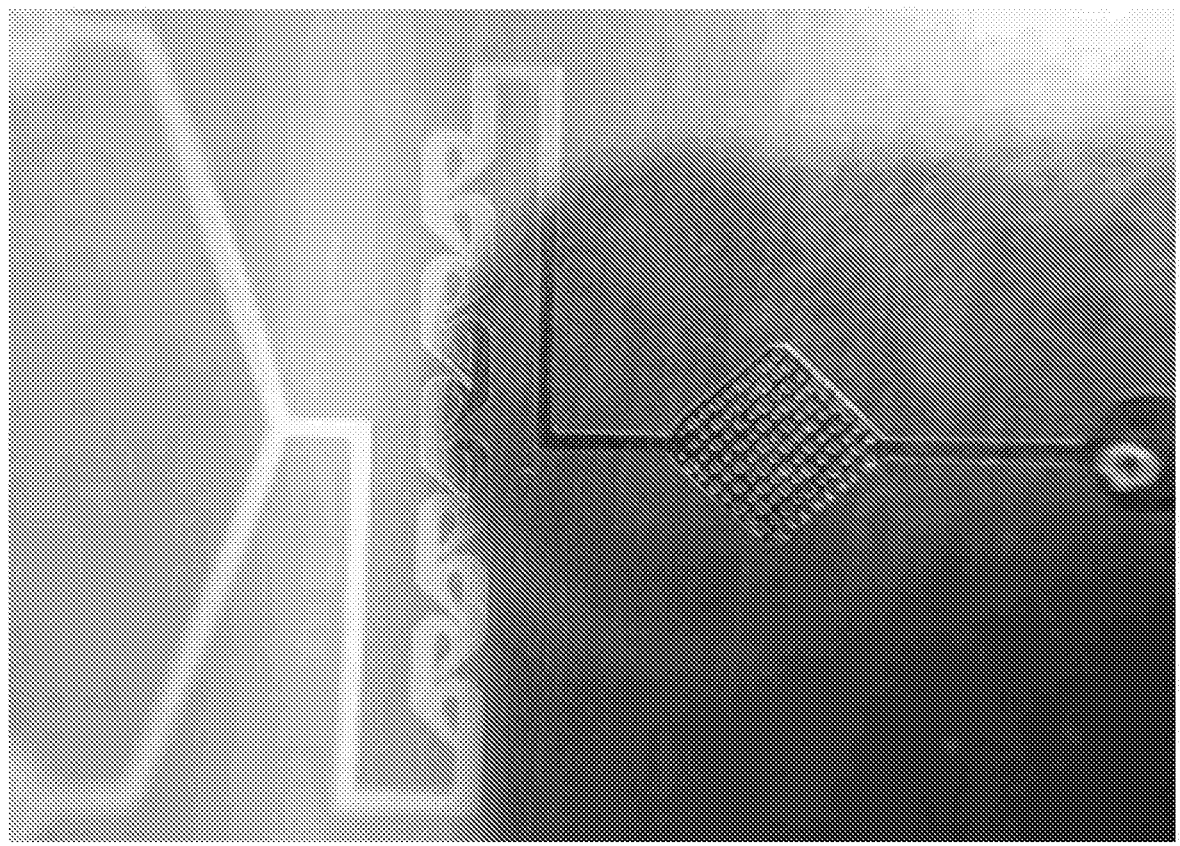
Figure 7C:
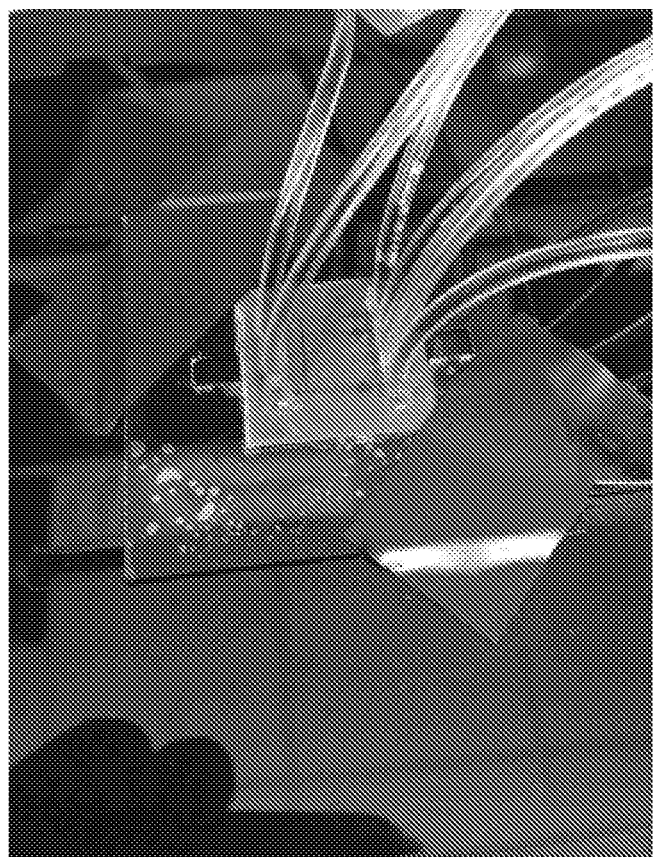
FIG. 7C depicts a flash fabricated flow gradient chip including inlet and outlet channels connected to the channels of the chip with different colored food dye used to highlight the channels, fabricated in accordance with an aspect of the present disclosure.

FIG. 7A depicts a completed microfluidic mixer and agglutination chip made in accordance with an aspect of the present disclosure in just 2.5 seconds, FIG. 7B is an enlarged view of the device of FIG. 7A. FIG. 7C depicts a flash fabricated flow gradient chip including inlet and outlet tubes connected to the channels of the chip.

EXAMPLES

The following examples are put forth so as to provide those of ordinary skill in the art with a complete disclosure and description of how to perform the methods and use the compositions and compounds disclosed and claimed herein.

Efforts have been made to ensure accuracy with respect to numbers (e.g., amounts, temperature, etc.), but some errors and deviations should be accounted for. Unless indicated otherwise, parts are parts by weight, temperature is in ° C., and pressure is in bar. Standard temperature and pressure are defined as 0° C. and 1 bar.

Example 1

We now provide a non-limiting example of pre-fabrication and fabrication steps for a device of the present disclosure.

Pre-Fabrication Steps

A bottom glass cover slide is placed in a prefabricated holder above the lens, of a light projector which is aligned by exposing the pattern to be printed. This operation is also used to focus the lens to the surface of the glass cover slide.

Once the focus and alignment are completed, enough photo curable resin is placed on the bottom surface, here a bottom glass cover slide, to be spread evenly across the upper surface of the slide. We then expose the photo curable resin to light from the projector for 4 seconds, without the top cover slide in position.

The uncured resin can be washed off, the exposed pattern remaining.

The distances between inlets and outlets and a map out of the spacing are measured.

Using a 70-Watt CO2 laser from Universal Laser Systems or a diamond drill bit, we etch or drill 0.5 mm inlet and outlet holes for the top glass cover slide corresponding to the dimensions taken from a first printed exposure without the top cover slide.

The top glass cover slide is now used as a reference and a second exposure is made to realign all inlet and outlet holes with the projected image.

Subsequent exposure(s) will not need more adjusting and the assembly can just be placed in a pre-aligned holder.

Fabrication Steps

Figures 8A, 8B, 8C, 8D, 8E:
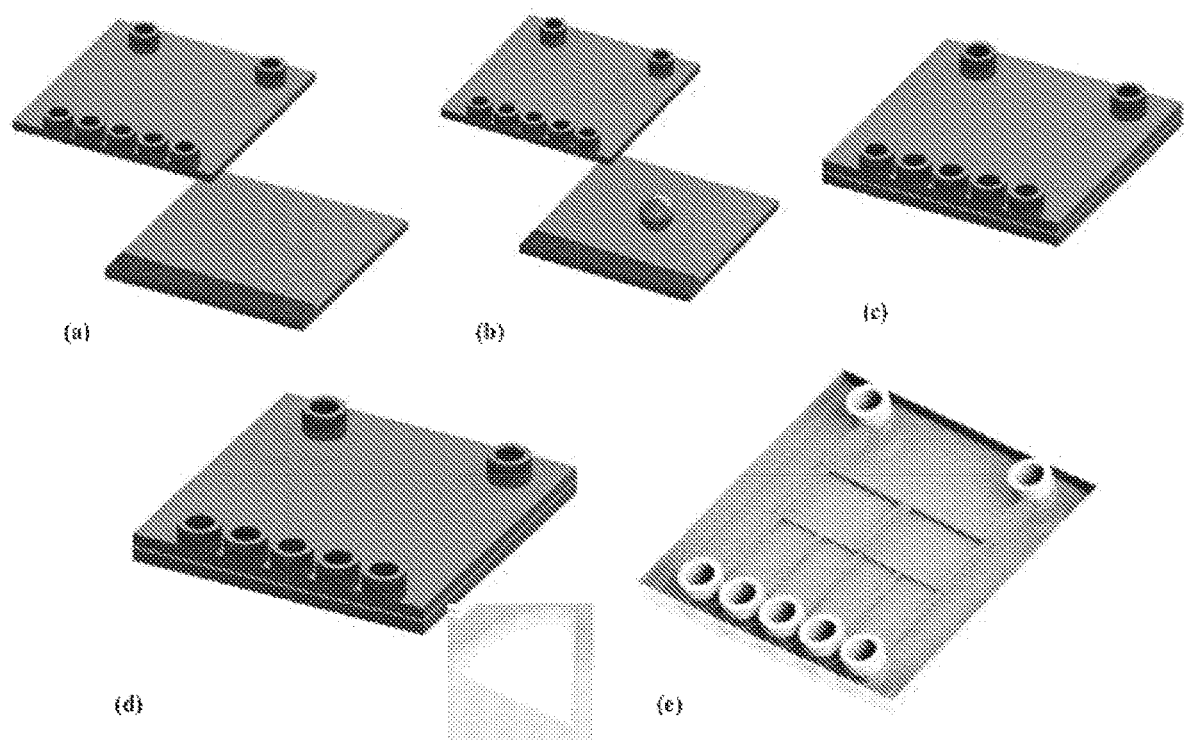
FIGS. 8A-8E depict various steps for fabricating devices in an aspect of the present disclosure.

Clean glass cover slides with Isopropanol (IPA). FIG. 8A.

The photo curable resin is at room temperature and the viscosity and volume play a part in the final thickness of the layer of the microfluidic chip.

Photo curable resin can be placed onto the bottom glass slide. FIG. 8B for example two drops of the resin.

The top glass slide (with predrilled holes) is placed on the resin, taking care that no air bubbles are trapped between the top glass cover slide and the applied photo curable resin on the bottom glass cover slide.

The two glass cover slides are then aligned with each other, FIG. 8C.

A 2-6 second exposure is made. FIG. 8D.

The chip is then taken to a vacuum line that is used to remove (withdraw) the non-cured resin.

While still under vacuum iso-propanol (IPA) is flushed though each channel for 2-5 min.

The chip is now ready to be coupled to inlet and outlet channels to then be tested and used. FIG. 8E.

Example 2

The present example provides a fast, simple, small, easy-to fabricate, robust and an inexpensive for fabricating microfluidic gradient devices using a light source, in particular, a projector for curing the resin. The gradient generator is dominated by diffusion having equal channel widths producing a low or almost static flow rate with minimal shear stress for cell culture applications. To carry out cell related studies, microfluidic devices are preferred to be biocompatible and hence a study on biocompatibility of the resin was also investigated for the fabricated devices.

In this example, the resin in its native form was not suitable for cell related studies. Hence, modification of the channel surface(s) to be suitable for drug delivery was studied versus the cell toxicity. The enhanced biocompatibility of devices fabricated with two different types of resins for cell based cytotoxicity test describes the utility of the developed devices to serve as a gradient generator.

Figure 9:
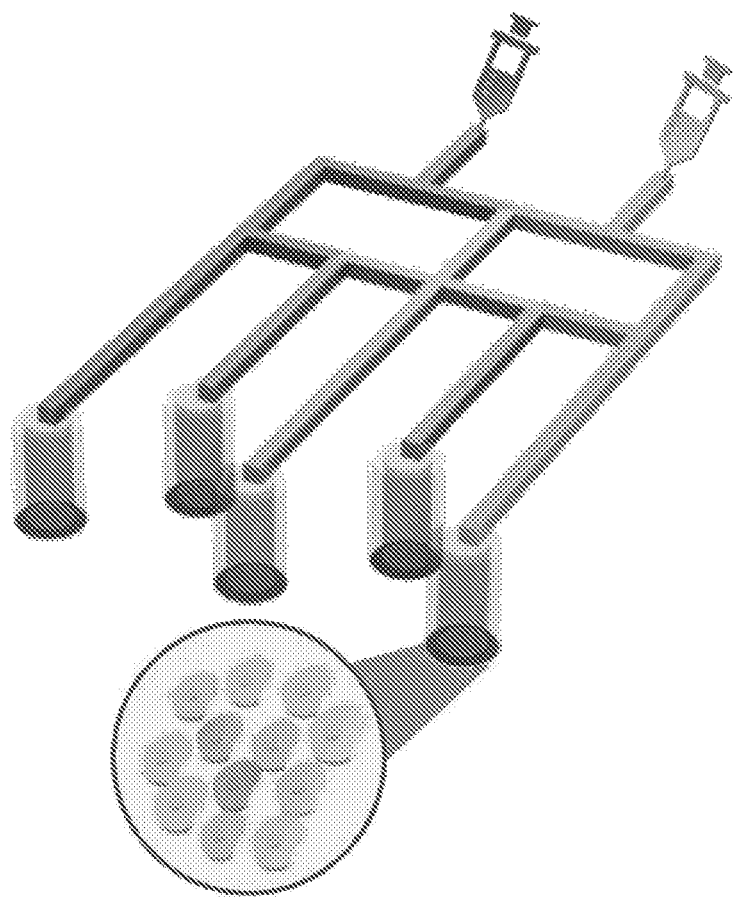
FIG. 9 is a schematic of a device set-up for cytotoxicity assay.

A conceptual diagram is illustrated in FIG. 9. The device is applicable to the biomedical field, taking into account certain factors like cost, resolution/speed, and resin compatibility, to ensure optimum results. This would find use in the area of medical diagnostics, especially for remote areas, leading to reduction of healthcare costs (27).

Simulation

The performance of gradients generated was quantified by simulating via commercial software COMSOL Multiphysics (COMSOL 5.1). A 3D model was built to assess the gradient profile in the presented design. In the numerical simulation models, the type of the fluid is incompressible Newton fluid, governed by the Navier-Stokes equation (28). The component of the fluid is water with the kinetic viscosity $v=1\times10^{-6}$ $m^2/s$ at room temperature. The concentrations of two different fluids to be mixed are set as $C=0$ $mol/m^3$ and $C=100$ $mol/m^3$ at inlet 1 and inlet 2, respectively, while the diffusion coefficient of the solute in water is $D=2.3\times10^{-9}$ $m^2/s$ (29).

Figures 10A, 10B:
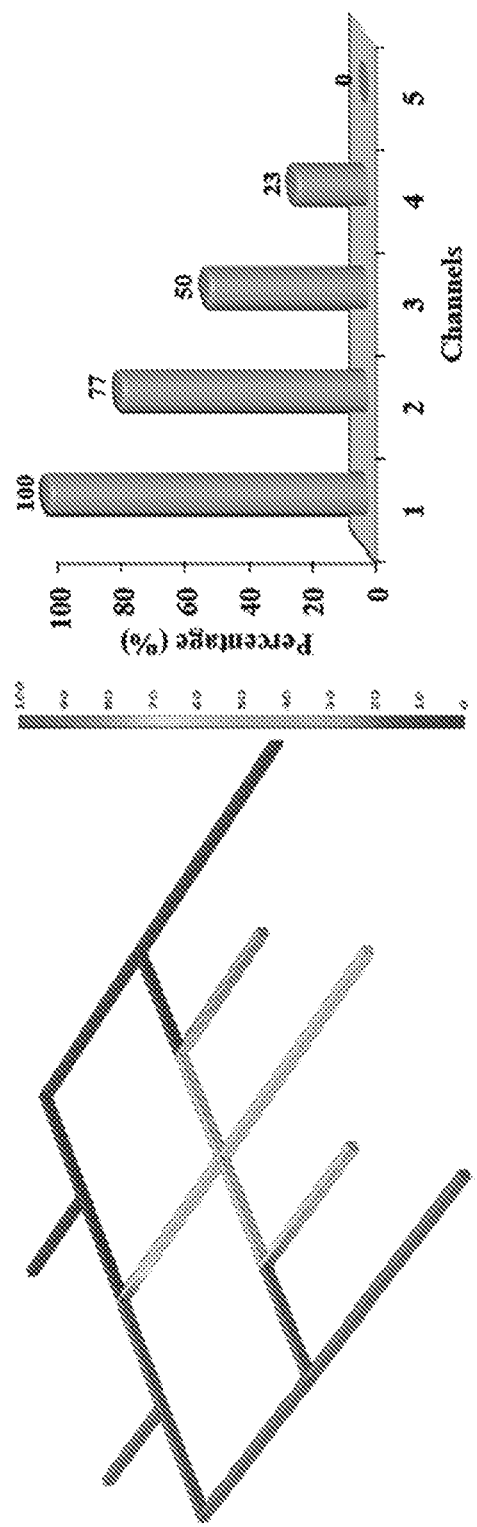
FIG. 10A depicts simulation results for a design of a gradient generator, the concentration of the fluids in the device as simulated by COMSOL.
FIG. 10B depicts the percentages of fluids at the outlets of the device of FIG. 10A.

The design of the gradient generator is shown in FIG. 10A. The gradient device had a fixed area of 25 mm×25 mm. The channel lengths were 12.5 mm. The widths of all the channels were 200 μm. The combined channel length was increased in the first stage compared to inlet section to increase the diffusivity within the channel. The concentration of the input specimen is 100 mol/m3, and the liquid medium is water. There are two inputs, which will sustain a laminar inflow, with a volumetric flow rate of 10 μl/min; and five outlets. The result of different concentrations obtained is shown in FIG. 10B. It is evident from the simulations results that the gradient generated five different concentrations of fluids.

Material and Methods

Samples

Biocompatibility of the resin was evaluated by culturing Hela cells cultured with the medium passed through the channels fabricated using the particular resin. Spot E elastic and FormLabs clear resin were purchased from FormLabs clear and Kudo with a definite composition for hardness, transparency and elasticity as they are the critical parameters required to build a microfluidic device. The Human cervical human cell line (Hela) was obtained from American Type Culture Collection (ATCC, USA). Fetal bovine serum (FBS), Eagle's Minimal Essential Medium (EMEM) and penicillin-streptomycin antibiotic were purchased from Invitrogen (USA). Cell Counting Kit-8 assay (CCK-8) and Doxorubicin were purchased from Sigma-Aldrich (USA).

Fabrication Method

Figure 11:
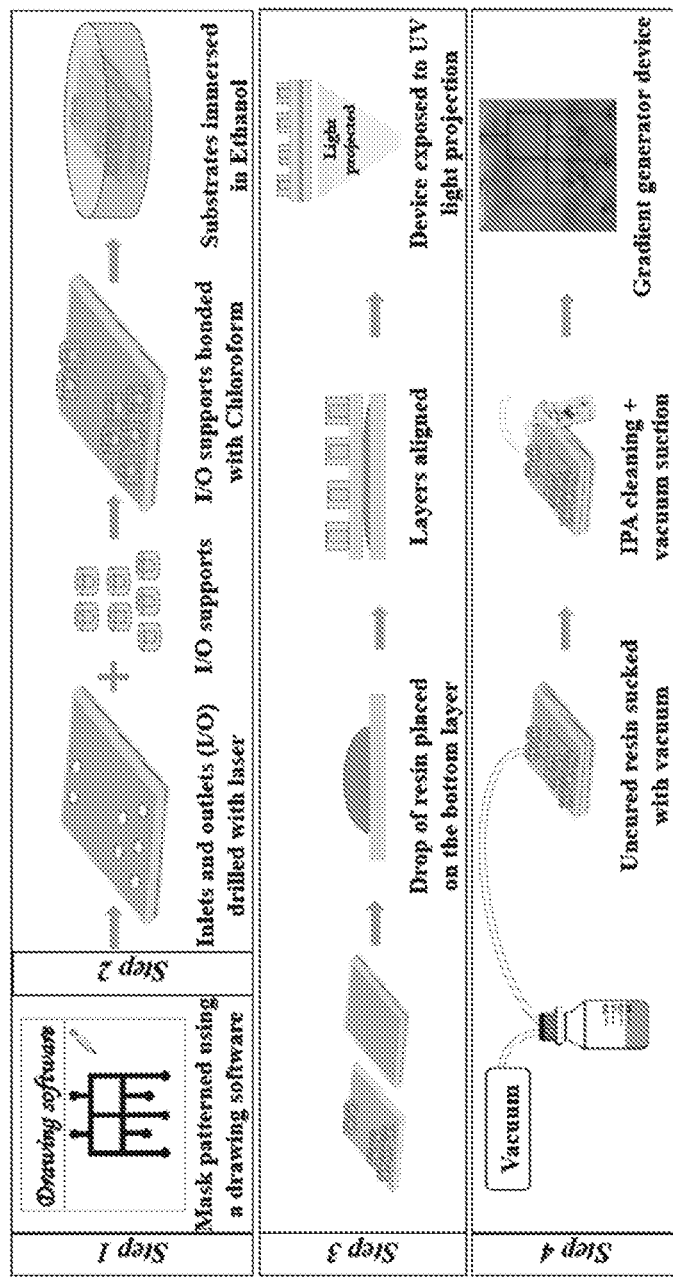
FIG. 11 illustrates a fabrication procedure for the device of FIG. 10A.

The microfluidic gradient generator was fabricated by subjecting the resin to UV for 2.5 secs or 15 sec for Spot-E elastic resin and FormLabs resin respectively in "one exposure". Kudo3D Titan 1 projector was used to solidify the exposed resin thereby forming channels. The process of fabrication is schematically represented in FIG. 11. This rapid fabrication method involves four major steps and requires less than 5 minutes to complete the device. Step 1: the pattern was sketched using any drawing software and imported as Portable Network Graphics (PNG) or Bitmap files (BMP). Usually, images have to be segmented using another program to get the 2dimensional cross sections to import to the KUDO printer. In this method, a .png file was used regardless of the slicing process. Therefore, a simple program, such as Microsoft Paint, can be used to save time to design gradient channels, requiring only one slice in the .png file. Step 2: The device to be fabricated consists of two layers of substrates (PMMA/glass). The tubing supports and inlets/outlets holes on the top layer were drilled via laser writing. Then, the tubing supports were bonded to the top layer of the device using chloroform. Both substrates were then immersed in ethanol and cleaned. Step 3: the substrates were dried, and a drop (about 5 µl) of resin was placed between the substrates. If needed, the two layers of substrates are aligned. The resin was allowed to settle for approximately 20 sec to obtain a uniform distribution of resin on the surface. It was then exposed to UV for 2.5/15 sec depending on the viscosity of the resin. Step 4: the unexposed resin was removed by applying vacuum to the uncured resin and the channels were washed with IPA, rendering clean microchannels. The device was then ready to be probed. The inlets and outlets connections were glued using PMMA support and Teflon tubings.

Cell Viability Test

Hela cells were cultured in EMEM media supplemented with 10% fetal bovine serum (FBS) and 1% penicillin-streptomycin at 37° C. in a 5% CO2 humidified atmosphere. After cell detachment, the cell suspension was centrifuged, the pallet was collected, and cells were counted for further plating. Hela cells were seeded in 96 well plates at a density of 5×103/well. Alter 24 h, cells were treated with five different concentrations of the anticancer drug Doxorubicin (DOX) generated by the microfluidic gradient generator at a flow rate of 8.5 µl/min. The incubation of cells with test samples lasts for 24 h at 37° C. Then, the culture medium was discarded, and 100 µL of CCK8 solution in MEM media were added to each well and incubated for 4 h in darkness. The absorbance values were measured at 590 nm using the xMark™ microplate absorbance spectrophotometer.

Preparation of Solutions

Phenolphthalein in its native form was obtained in powdered form. 1% solution of phenolphthalein is used as an indicator in the experiments. Therefore 1 g of phenolphthalein was dissolved in 50% ethanolic solution and made to 1% indicator-solution and stored in an eyedropper bottle, Hydrochloric acid (1 N) was prepared and to 9.90 ml of acidic solution, 10 µl of prepared 1% phenolphthalein was added as an indicator. NaOH 1 M solution was used as a basic solution in the pH test experiment.

Resin Biocompatibility Test

Two types of 3D printer resins (1) FormLabs clear and (2) Spot-Elastic were used to build microfluidic devices. The media for cell cultures were injected by passing the EMEM media through the reported microfluidic gradient generator, Both the inlets were fed with media for the first experiment. The results suggested that the resins in their native form could not be used for the present studies, Hence, a surface modification was applied to the channels (30, 31), Therefore, the microchannels were surface modified as discussed further to test for compatibility with cell culture and cytotoxicity. The modification revealed better cytotoxicity results when compared to resins in their native form. Doxorubicin was introduced to the cell culture after surface modification, and only one of the inlets was fed with Doxorubicin incorporated EMEM media and the other was fed with normal (Doxorubicin-free) EMEM media.

Surface Modification

Figure 12:
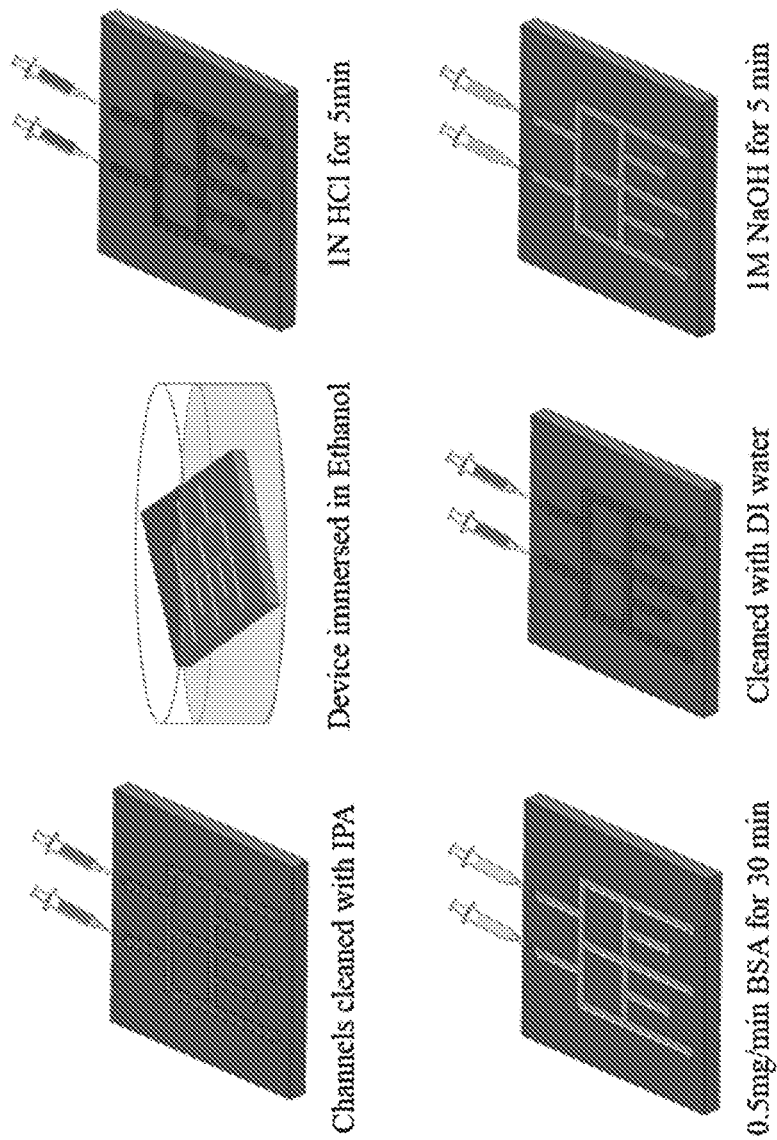
FIG. 12 illustrates a surface modification procedure within the channels of the device of FIG. 10A.

The microchannels fabricated via projector-based method were surface treated to improve resin compatibility for cell culture. The surface modification within the channels is illustrated in FIG. 12, generally beginning on the right side of the figure and going clock-wise around the figure. Before utilizing the microfluidic devices, they were treated by flushing in 0.1N HCl and 0.1 M NaOH for five minutes each. Subsequent to this acid/base treatment; the channels were injected with DI water completely to clean the inner surface of the microchannels. Finally, these microchannels were introduced with 0.5 mg/ml BSA, to coat the inner surface thereby enhancing the attachment of BSA to the walls limiting the direct interference of the resin material with the cell culture medium. Then, these printed microchannels were cleaned with DI water again to remove any remaining unattached BSA. This surface modification treatment greatly enhanced experimental outcomes, without changing solution concentrations. With this ionic treatment and the coating of a BSA to the surface, there was no free resin surface to interact with the cell medium that we used.

Results and Discussions

The fabrication technique is based on stereolithography. It is highly reproducible and fast method for building microchannels. The complete device fabrication process takes less than 5 mins and involves four major steps. 1. Drawing a pattern of the device in a software like paint brush or power point takes about a minute. 2. Drilling inlet/outlet supports and inlet/outlet holes on the top substrate via laser writing and takes about 1 minute. The drop of resin added to the bottom layer, is allowed to settle for 20 secs. 3. Pre-alignment requires about 2 minutes and the exposure rate of resin depends on viscosity and takes about 15 secs. In this case, Spot-E required 2.5 secs and FormLabs required 15 sec of exposure. 4. Flushing of the device with IPA to remove uncured resin takes about 1 min. The depth of the microchannels is controlled by the amount of resin added during fabrication. On adding 5 µl of resin, upon the losses from inlet/outlet holes we get the structures more than 10 µm. If spacers are added between the top and bottom layer of the device, then we can get structures higher than 50 µm. The whole fabrication process takes less than 5 min per device. Although 3D printing technology has the advantage of simplicity and low setup costs. It is difficult to print internal micro channels below 1 mm and currently printing rates of 22 mm/hr are achievable, in contrast to this unconventional method using 2.8 sec exposure time and around 2 min of flushing a completed microfluidic chip, using the Spot-E elastic resin. A detailed study on height and resolution of the structures obtained via this fabrication is presented earlier (32). The time of exposure varies for various resins as it depends on the viscosity of the resin. The FormLabs clear resin was exposed for 15 sec to obtain the device due to the higher viscosity of the resin compared to Spot-E.

Existing most prominent fabrication technologies have been compared to this technology. Table 1 summarizes the merits of the technology. Although silicon technologies (7, 8, 15) have better resolution (1 µm) the time and cost required to fabricate channels are high. Laser etched devices are hard to integrate with electronics. However, it is possible to integrate with soft lithography technology. Also, the minimum channel dimensions vary from 50 to 100 µm depending on many factors like the height of the substrate and speed of the laser (14). In the proposed work, it takes few minutes to build a complete device which includes probing and the ease-of-integration (due to small size) of these devices into other devices is a merit.

TABLE 1

Comparison of existing technologies to the proposed fabrication method

| Fabrication technology | Fabrication time (Speed mm/min) | Resolution (μm) | Depth (μm) | Initial setup costs |
|---|---|---|---|---|
| 3D printing (18) | 22 mm/hr | 250 μm | 1 × 2 mm | Low |
| Maskless lithography or PDMS casting (7) | 2 mm/sec Casting >1 hr | ~5 μm | >2 μm | High |
| Bonding/dry etching/clean room/anodic bonding (8) | >4 hrs | >1 μm | >1 μm | High |
| PDMS casting (12) | 1650 mm/sec Casting >1 hr | 25 μm | >20 μm | Medium |
| PMMA laser thermal bonding (14, 33) | 125 mm/sec Bonding >45 min | >150 μm | >20 μm | Medium |
| Flash foam mold/PDMS casting (34) | 3-5 min Casting >1 hr | 200 μm | ~25 μm | Low |
| Dry film resist (15) | >1 day | 10 μm | >5 μm | High |
| This work | >2.8 sec 2 min flushing | 40 μm | >10 μm | Low |

Only the device fabrication time of the mentioned methods are considered excluding the probing time for each method.

Usually, gradient chips require few centimeters long channels that need to be mounted on glass (35) or PMMA substrate. But the presented chip produces gradient by maintaining equal dimensions of the channel as shown in FIG. 13. An illustration of the device is shown in FIG. 13A. Dyes (green and red) were injected to demonstrate the gradient obtained in the device and is represented in FIG. 13B. The carefully designed geometry of the demonstrated device is one of the key to obtain a good diffusion based gradient generator. These gradient generators are easy to handle, fabricate and suitable to work best with low flow rates like any other device fabricated through traditional techniques. Diffusion based gradient generators working under low flow rates are preferred in cellular studies and chemotaxis (36) studies due to the isolation of convectional flow and production of low or nearly static flow. The diffusive time of two solutions with different concentrations varies with the volumetric flow rate. In other words, when the flow rate is faster, the diffusive time is shorter and vice versa. At higher flow rates (more than 100 μl/min), they do not produce a good gradient, as there would be no sufficient time for the molecules to diffuse in the combining channel. In the model, we maintain equal flow at every stage. Two inlets were combined into one channel in the first stage and further divided into three channels in the second stage. At the end, five channels would give five different concentrations. We expect two outlets at the extreme ends to give the same concentration as the inlet, and the middle gives the exactly 50% concentration of inlet 1 and inlet 2 as shown in schematic diagram and dye visualization test in FIGS. 13A and 13B.

To evaluate the resistance of chemicals to resins we performed a simple chemical test. The chemical test involved a reaction between an acid and a base with phenolphthalein as an indicator. Phenolphthalein was added into the acidic solution. When the acid and base mix the color changes from dark pink, light pink to colorless based on the pH value of the solution. The gradient generator demonstrated here had colorless fluids at the channels 1 and 5 while the color of the fluids was changing in the middle channels from dark to light pink. The pink color regions indicate the fluids are mixed.

The mixing of fluids in the channels is shown in FIG. 14. There was no indication of chemicals reacting with the resin that is preferable in building devices for chemical application. The design consists of 18 straight lines (L) that change direction at 10 nodes (N) represented in FIG. 14B. The inlet channel lengths ($L_1$ and $L_2$) are shorter that the channels divided at the first stage ($L_9$, $L_8$, $L_7$) to increase diffusion in those channels. This aids in better mixing of fluids in those channels. In the second stage, the channels $L_{17}$ and $L_{15}$ are shorter than channels $L_{15}$, $L_{16}$, and $L_{14}$ to maintain the same length throughout the channels at each stage. It is worth noting the native color of the Spot-E resin is light pink and that the outer channels (FIG. 14A) are colorless as the input fluids are colorless.

The resin that is discussed throughout the experiments is the 3D printing resin, which is not compatible with all biological process. Not all resins that were tested are suitable for all biological applications. About six different resins were tested for applications such as PCR and protein interacting reaction (agglutination) and found that not all were suitable for these applications (37). Therefore, as a pilot study, surface modification was employed to improve the compatibility of these resins. A thin film of resin was fabricated using this stereolithography based method and the results of biocompatibility before and after the modification was enumerated in the following table.

TABLE 2

Test for biocompatibility of the resin

| Resin type | Before Modification | After Modification |
|---|---|---|
| Flexible | — | Bio-compatible |
| Spot-HT | Bio-compatible | Bio-compatible |
| Forms Labs Clear | Bio-compatible | Bio-compatible |
| Venus Clear | Bio-compatible | Bio-compatible |
| Spot-E | — | Bio-compatible |
| Marker Juice G+ | — | Bio-compatible |

Although these studies can be demonstrated in all of the above-tested resins, FormLabs clear and Spot-E were utilized for further experiments. Spot-E was chosen to demonstrate that this compatibility study could be investigated for non-transparent material while FormLabs was chosen due to its transparent nature and that are currently preferred in microfluidics. The pilot study showed Spot-E elastic might be protein absorbent, and it could not be used for agglutination process. Therefore, efforts were made to surface treat and utilize them for further experiments.

FormLabs clear resin was suitable for protein interacting reactions and we assumed that it should be compatible with cell applications. Attempts were made to culture cells on these resins but failed, as the resin was not compatible with cells. Although the resin is not compatible for culturing cells on it, a pilot study on the biocompatibility of the material suggested that it could be used for other biological applications such as polymerase chain reaction (PCR) and agglutination phenomena. Therefore, it was used for injecting the cell culture medium after surface modification of channels with Bovine Serum Albumin (BSA). We suppose the channel made of this UV curable resin did react with the EMEM medium and hence less cell viability. On treating the surface, the walls of the channel were coated with BSA preventing the medium to be in direct contact with the walls of the channels. This enhanced the cell viability substantially and therefore; suggests that this surface modification be incorporated into 3D fabricated microfluidic devices to benefit the cell culture process.

Figures 15A, 15B:
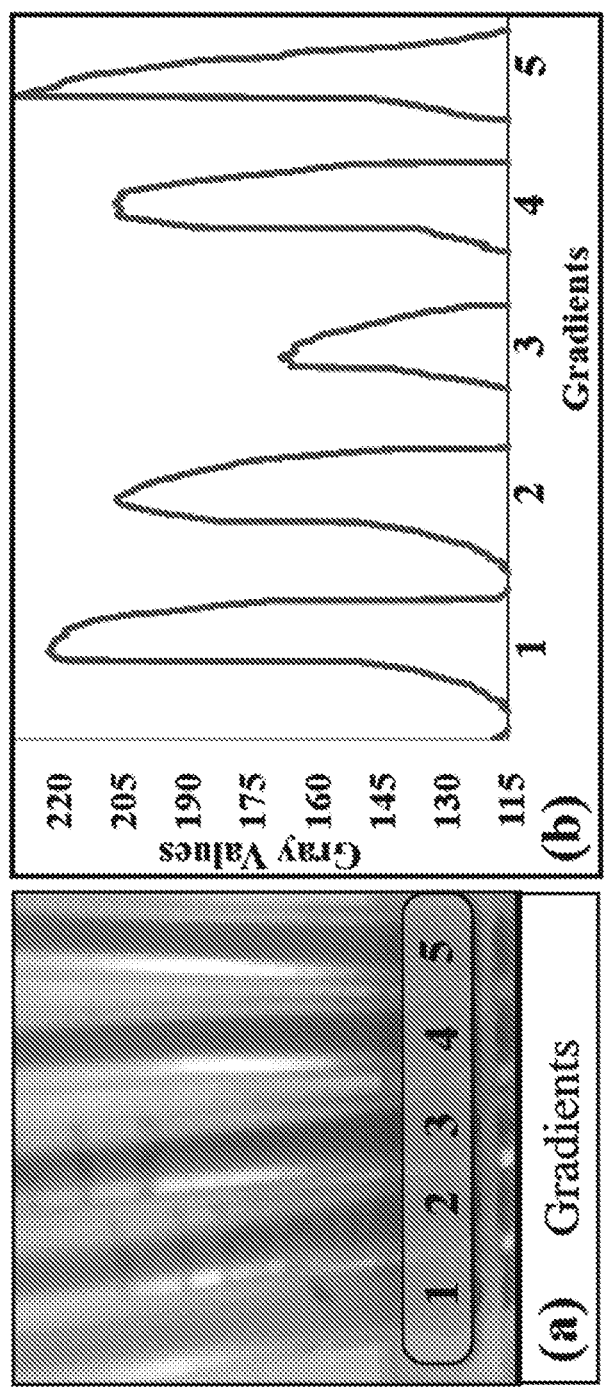
FIG. 15A depicts a gradient profile processed via ImageJ software.
FIG. 15B is an image of the gradient obtained at each outlet.

To ensure the gradient profile obtained by the channels, we mixed two (green & red) dyes and demonstrated a good concentration gradient across the chip. From the FIG. 15A it is evident that at 10 μl/min the device produced good gradients. The inlets were fed with dyes and the gradient obtained at the outlet was collected into Eppendorf tubes. The color was varying from each outlet. Gradient profile of the microfluidic device was obtained via Image J software produced at the outlet tubes of the gradient device. Each channel has a specific gray value according to the change in color at the outlet tubes. Outlets were numbered, and the particular gray value of the outlet corresponds to the gradient obtained and is as shown in FIG. 15B. The gradient chip that has a simple network was designed considering the calculated fluidic resistance in each channel and the channel dimensions were determined according to the simulation results.

Once the gradients were obtained, it was tested for cell culture by supplying medium injected through these microchannels. Two experiments were performed: 1. Channels fabricated with resin and using them to inject the medium directly, 2. Channels fabricated and modified to use then for injecting cell culture medium. In the first run, FormLabs clear resin showed high toxicity, resulting in around 22% live cells while spot-E resin; more viable cells from the first channel (1) followed by a dramatic decrease in cell viability through all the four subsequent channels. However, the channels coated with BSA enhanced the cell viability substantially.

Figure 16A:
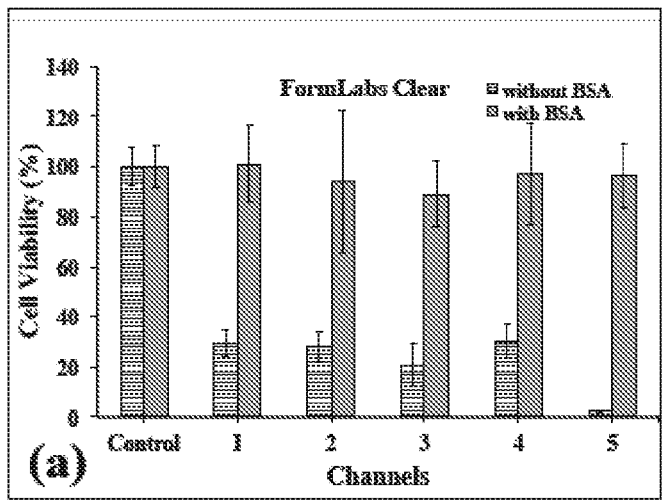
FIGS. 16A-16C depict cell viability for: (a) FormLabs clear resin; (b) Spot-E resin; and (c) DOX induced in different concentrations via microfluidic gradient generator.
Figure 16B:
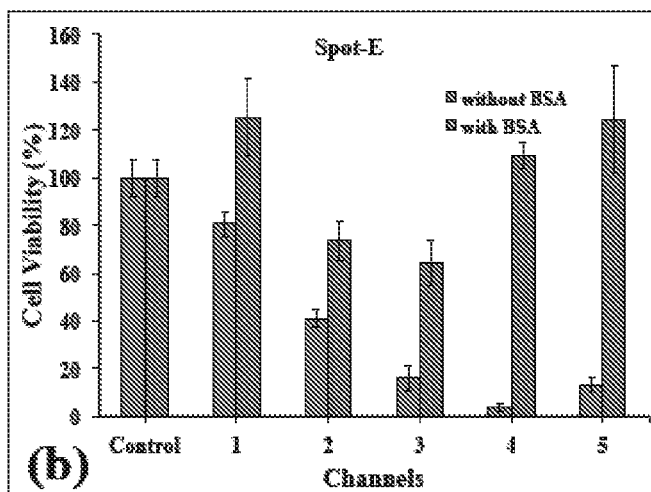

The number of viable cells significantly increased to around 95% for cells incubated with media build of FormLabs clear resin as depicted in FIG. 16A and greater than 70% cell viability for those treated with BSA for spot-E resin as enumerated in FIG. 16B. The inlets were fed with EMEM medium and the five outlet samples from the device were utilized to culture cells. These results confirm the significance of BSA-coated channels to enhance the device biocompatibility showing in high cell viability.

Figure 16C:
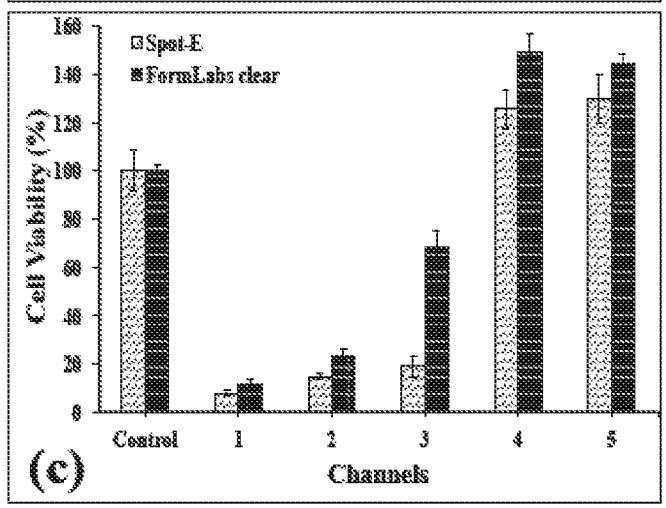

Further to ensure the gradient profile generated via the microfluidic device and test for cytotoxicity, EMEM medium containing DOX was fed through one of the inlets and normal EMEM medium (DOX-free) medium was fed through the other inlet. The gradient generated was varying from 100-0 μg/ml of DOX at the outlet ports. Cell viability patterns starting from higher toxicity in channel 1 to the lowest in channel 5 are depicted in FIG. 16C. The results indicate higher viability with a decrease in concentration of DOX. The results suggest that FormLabs clear is the better when compared to Spot-E due to high cell viability. It is also inferred that FormLabs clear resin could be used for building flexible microfluidic devices after surface modification.

The present system outperforms other traditionally used methods. The device is diffusion-based and hence works well at low flow rates. It can be used for an application that inculcates slow flow rates such as cellular studies (5, 35), cell migration (38), neuronal studies (39).

In conclusion, a simple, easy to fabricate, miniaturized microfluidic gradient generator for drug testing/discovery applications is provided. The fabrication methods enable rapid prototyping of microfluidic devices i.e. in less than 5 minutes. This gradient that operates at low flow rate is suitable for cell culture application due to low or even static shear on the cells. The performance of this diffusion based gradient generator remains unchanged compared to the devices fabricated via conventional methods at a fraction of the setup cost, and considerable time saving. The evaluation of certain biological applications such as PCR and agglutination called for surface modification of the channel. The surface modified channel enhanced cell viability to a greater extent i.e. from 30% to 90%. The cell toxicity assay revealed that cells, which absorbed less DOX, had high proliferation rate. The miniaturized size and smart-geometry of the chip aid these gradient generators to find applications in drug testing/discovery, organ-on-chip, and Micro Total analysis systems (μTAS)/Lab-on-chip devices.

Example 3

We now provide an example of fabrication of a microfluidic droplet generator of the present disclosure. Active and passive microfluidic droplet generators are becoming very popular and provide a wide range of applications. These include single cell analysis, drug delivery to tissues and organs, characterization and synthesis of materials and biochemical analysis (42). The most common technologies adapted to fabricate microfluidic devices are photolithography (43) soft lithography (44), laser writing (45), dry-film etching (46), and CNC-milling (47). Although researchers are making advancements in the fabrication process of microfluidic devices and diagnostics (48), they are still expensive, time consuming and require specialized equipment.

A droplet generator chip usually consists of either a T- or a Y-junction. Most recent are the stackable droplet generators with a throughput of 1 $Lh^{-1}$ (49). Reliable and consistent microdroplets benefit a broad range of applications such as a single cell or particle encapsulation, microcapsules, micro-gel beads and nano-composite beads.

Provided in this example is a droplet generator fabricated using the present methods. Also, the efficiency of droplet generator using "flash microfluidics", a low-cost, rapid fabrication method, is shown, along with a study on the droplet size with varying flow rates using this method. It takes around 5 minutes to build the complete device without the need of an expert in the fabrication process.

Figure 17:
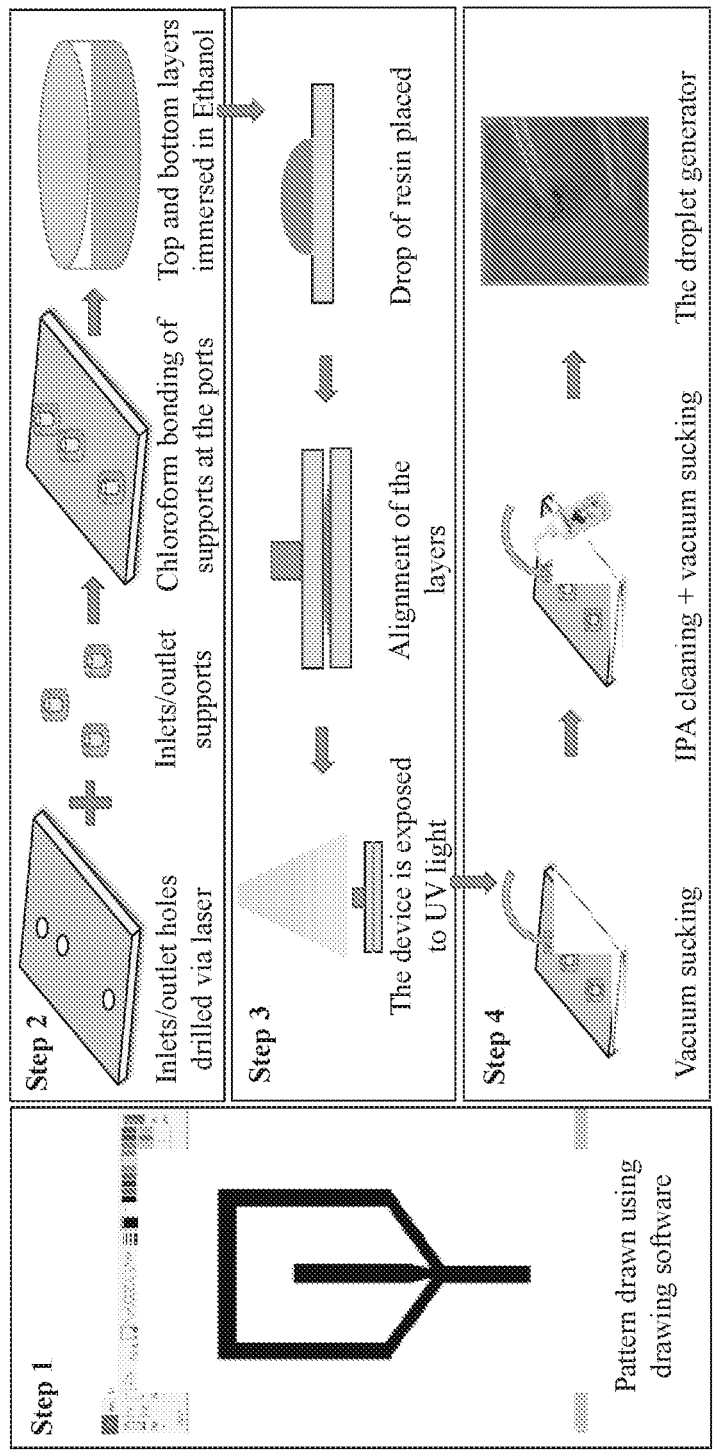
FIG. 17 illustrates a flash fabrication method of the present disclosure.
Figure 18:
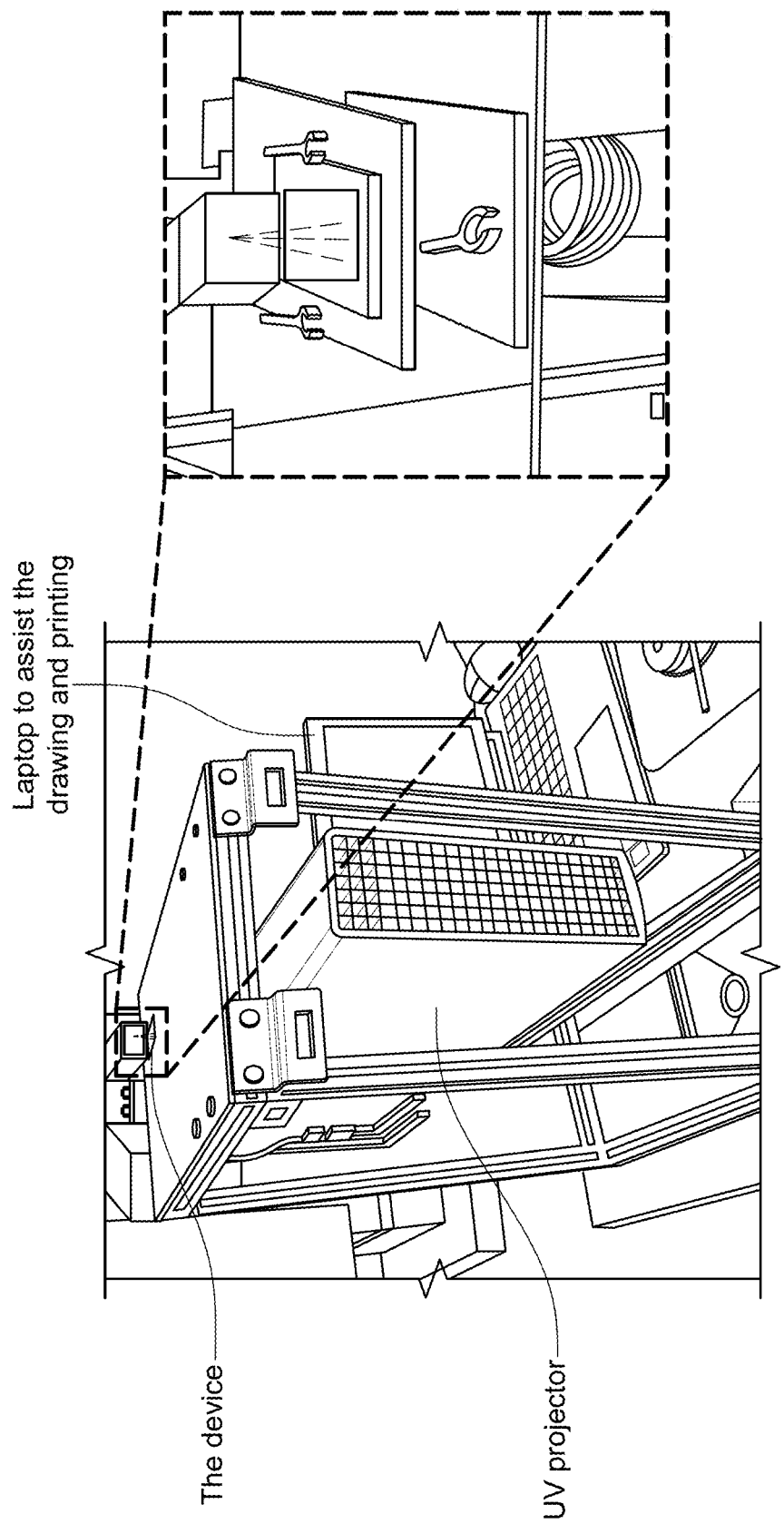
FIG. 18 depicts a Kudo3D Titan 1 printer functionality.

The rapid fabrication method of the present example consists of four steps and is illustrated in FIG. 17. In the first step, step 1 of FIG. 17, the pattern of the device to be exposed is sketched using any drawing software and imported as Portable Network Graphics (PNG) or Bitmap files (BMP) into a Kudo3D Titan 1 printer at a resolution of 40 μm. The device to be fabricated consists of two layers of PMMA. Two layers with dimensions of 25×25 $mm^2$, the holes which measure 1 mm each and the supports were drawn using CorelDraw. Then, in Step 2, all the components of the device were fabricated and the top layer of the device was drilled with the inlet/outlet holes or ports via laser writing. Supports for the inlet/outlet ports were added using chloroform bonding, To avoid the formation of bubbles inside the channels while printing, the substrates were cleaned with ethanol and dried using $N_2$ gas. In Step 3, a drop (20 ul) of Spot-E resin is sandwiched between the two PMMA layers ensuring a good alignment. The device is then exposed for 6 seconds to cure the resin within the considered pattern. The H6510BD DLP projector from displays the pattern, previously drawn and imported into PNG, on the chip. The UV light of the printer attacks only the white space on the picture. The resin on top of the black pattern remains intact. FIG. 18 shows the functionality of the printer using the present Flash method. In Step 4, the uncured resin is removed by applying vacuum to suck out the uncured resin and cleaned by flushing isopropanol (IPA) to remove any unpolymerized (uncured) resin. Additional vacuum can be applied to remove excess IPA and any residual uncured resin. Finally, the device is probed using Tygon tubes with an inner diameter of 1 mm and outer diameter of 1.2 mm. Two Harvard Apparatus syringe pumps were used with two different flow rates. Two 5 ml syringes were attached to the Tygon tubes, one containing food dye and the other the oil. Both the dye and the oil are injected into the two inlets of the droplet generator.

Figure 19:
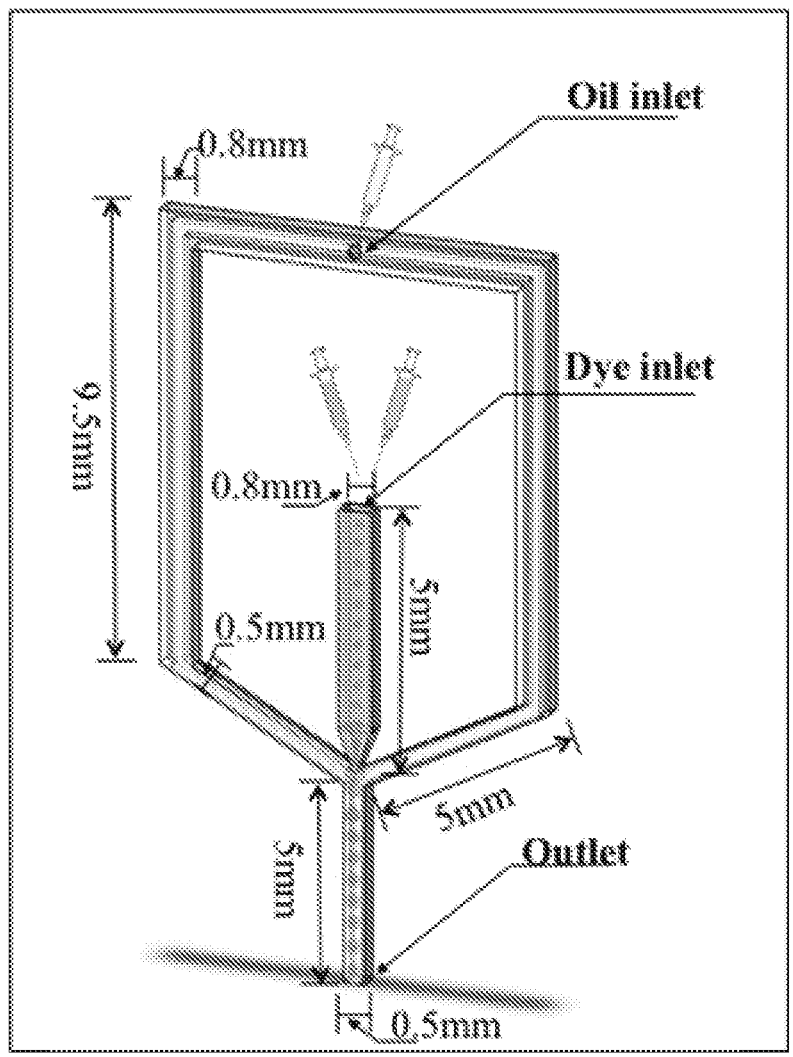
FIG. 19 depicts a droplet generator design of the present disclosure.
Figures 20A, 20B, 20C, 20D, 20E, 20F:
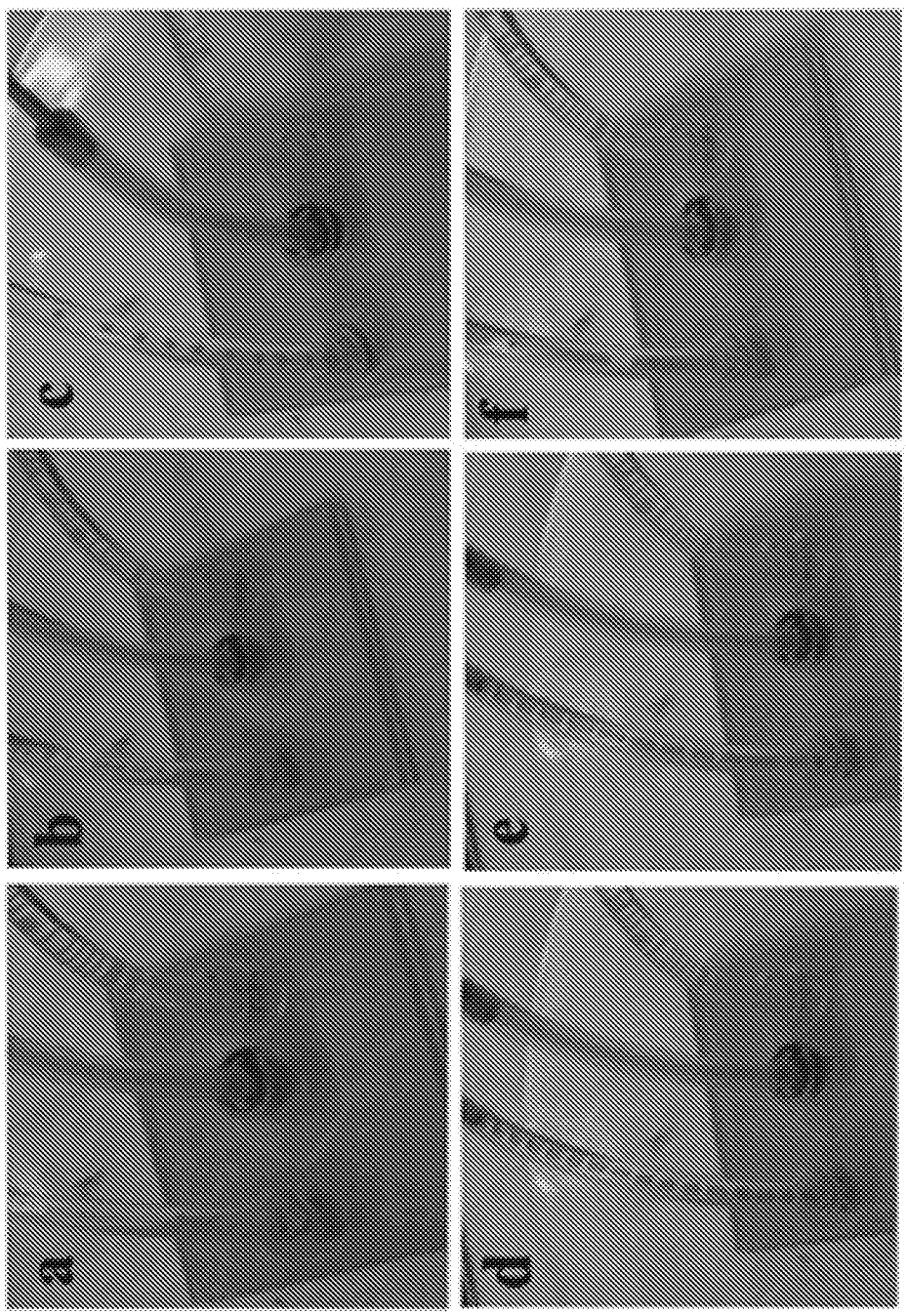
FIGS. 20A-20F show a wide range of droplet sizes for different flow produced by the droplet generator.

A schematic of the droplet generator fabricated via the present "flash" microfluidics method and the design concert of the device are shown in FIG. 19. To prove the efficiency of the droplet generator, orange dye was used in inlet 1 and oil in inlet 2. Using different flow rates, the device successfully and uniformly generates droplets with different sizes and speed.

The exposure rate depends on the viscosity of the resin. The exposure for the Spot-E resin, used in this example, is 6 seconds. However, about 6 different types of resin were tested. The maximum exposure rate was 15 seconds for highly viscous resin—FormLabs flexible (50). Even though 3D printing (51) and inkjet printing (52) are fast, they can take around 20 minutes to fabricate a simple device. However, the present "flash" fabrication process including cleaning and probing takes about 5 minutes to complete a device. Comparisons between the most common techniques with reference to fabrication time, cost and resolution are tabulated in Table 3. The Flash Technique in Table 3 is in reference to the present "flash" method.

TABLE 3 comparison of fabrication methods

| Technique | Time | Resolution | Cost |
| --- | --- | --- | --- |
| Photolithography | 8 h | 2 μm | High |
| Soft-lithography | 4 μm/min | 5 μm | High |
| Laser-writing | 2 h | 150 μm | Medium |
| Dry-film-etching | 40 min | 35 μm | Medium |
| CNC-milling | >1 h | <25 μm | High |
| 3D printing | 2 h | >1 mm | Low |
| Inkjet printing | 1.5 h | >40 μm | Low |
| Flash | 5 min | >38 μm | Low |

Moreover, the biocompatibility of the resin has been presented recently (53, 54). The demonstrated droplet generator achieves a wide range of droplet sizes (40×) as shown in FIGS. 20A-20F. The size of the droplet varies with the flow rate of continuous medium and dispersed medium. The droplet sizes were small when the inlet of water (mixed with orange dye) was less than the oil. Whereas the droplet size was bigger when the flow rate of oil was less than the water. To obtain varying uniformly sized droplets the flow rates of FIGS. 20A-20F were set as tabulated in Table 4.

TABLE 4

Droplet size for various flow rates

| FIG. 3 | Oil (μl/min) | Dye (μl/min) | Size (mm) |
| --- | --- | --- | --- |
| a | 30 | 1 | 0.17 |
| b | 20 | 5 | 0.56 |
| c | 10 | 5 | 0.73 |
| d | 5 | 10 | 1.34 |
| e | 5 | 15 | 2.23 |
| f | 5 | 20 | 8.71 |

The present easy, low-cost fabrication process is useful in building cheap microfluidic devices within a few minutes. The minimum dimension obtained via this fabrication method in this example is 40 μm, that is in the acceptable range for building a microfluidic device. The fabrication process utilizes photopolymers, which makes the devices cheap (<$1) and affordable to be used in disposable microfluidics. The droplet generator demonstrated provides uniformly sized beads like any other droplet generators fabricated using traditional methods. A wide range of droplet sizes (0.2 mm to 8 mm) produced with the demonstrated device finds application in a variety of fields such as cosmetics, personal care, paint/coatings, drug delivery and imaging agents.

As can be seen from the foregoing, as compared to previous techniques used for microfluidic fabrication, our present systems and methods are fast. In various aspects we can use one fabrication step that bonds and fabricates the microfluidic device. Thereafter, only a cleaning procedure needs to be done, followed by connection of inlet and outlet channels to the inlet and outlet ports of the channels of the microfluidic device. Thus, it can be seen that our present systems and methods also provide a greatly simplified procedure for fabricating microfluidic devices as compared to previous systems and methods.

Ratios, concentrations, amounts, and other numerical data may be expressed in a range format. It is to be understood that such a range format is used for convenience and brevity, and should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1% to about 5%, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figure of the numerical value. In addition, the phrase "about 'x' to 'y'" includes "about 'x' to about 'y'".

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

REFERENCES

1, Faustino V, Catarino S O, Lima R, Minas G. Biomedical microfluidic devices by using low-cost fabrication techniques: A review. Journal of Biomechanics. 2015.

2. Adams J D, Tom Soh H. Perspectives on utilizing unique features of microfluidics technology for particle and cell sorting, JALA (Charlottesville, Va.). 2009; 14(6):331-40.
3. Ho C-T, Lin R-Z, Chen R-J, Chin C-K, Gong S-E, Chang H-Y, et al. Liver-cell patterning Lab Chip: mimicking the morphology of liver lobule tissue, Lab on a Chip. 2013; 13(18):3578-87.
4. Yoon No D, Lee K-H, Lee J, Lee S-H. 3D liver models on a microplatform: well-defined culture, engineering of liver tissue and liver-on-a-chip. Lab on a Chip, 2015; 15(19):3822-37.
5. Sivashankar S, Puttaswamy S V, Tz-Shuian D, Ciou-Wun L, Shih-Mo Y, Hwan-You C, et al., editors. Emulated circulatory system integrated with lobule-mimetic liver to enhance the liver function. IEEE 25th International Conference on Micro Electro Mechanical Systems (MEMS); Jan. 29, 2012-Feb. 2, 2012.
6. Chao T-C, Ros A. Microfluidic single-cell analysis of intracellular compounds. Journal of The Royal Society Interface. 2008; 5(Suppl 2):S139-S50.
7. Wu F, Dekker C. Nanofabricated structures and microfluidic devices for bacteria: from techniques to biology. Chemical Society Reviews. 2016; 45(2):268-80.
8. Kung P C, Kung Y-L, Holcombe D, Grace R H, Ungelenk G, Piechotka E, et al. A Rapid Prototyping and Mass-Production Platform of Microfluidic Devices. Technical Proceedings of the 2007 NSTI Nanotechnology Conference. 2016; 13:15.
9. Taylor J M, Argyropoulos C, Morin S A. Soft Surfaces for the Reversible Control of Thin-Film Microstructure and Optical Reflectance, Advanced Materials. 2016.
10. Lu H, Zhang H, Jin M, He T, Zhou G, Shui L. Two-Layer Microstructures Fabricated by One-Step Anisotropic Wet Etching of Si in KOH Solution. Micromachines. 2016; 7(2):19.
11. Parekh D P, Ladd C. Panich L, Moussa K, Dickey M D. 3D printing of liquid metals as fugitive inks for fabrication of 3D microfluidic channels. Lab on a Chip. 2016; 16(10):1812-20.
12. Carugo D, Lee J Y, Pora A, Browning R J, Capretto L, Nastruzzi C, et al. Facile and costeffective production of microscale PDMS architectures using a combined micro-milling-replica moulding (pMi-REM) technique. Biomedical Microdevices. 2016; 18(1):1-10.
13. Chang T-L, Chen Z-C, Lee Y-W, Li Y-H, Wang C-P. Ultrafast laser ablation of sodalime glass for fabricating microfluidic pillar array channels. Microelectronic Engineering. 2016; 158:95-101.
14. Sivashankar S, Agambayev S, Mashraei Y, Li E Q, Thoroddsen S T, Salama K N. A "twisted" microfluidic mixer suitable for a wide range of flow rate applications. Biomicrofluidics. 2016; 10(3):034120.
15. Leech P W, Wu N, Zhu Y. Application of dry film resist in the fabrication of microfluidic chips for droplet generation. Journal of Micromechanics and Microengineering. 2009; 19(6):065019.
16. Beebe D J, Mensing G A, Walker G M. Physics and Applications of Microfluidics in Biology, Annual Review of Biomedical Engineering. 2002; 4(1):261-86.
17. Zhou M, Jiang B, Weng C, Zhang L. Experimental study on the replication quality of micro-nano cross-shaped structure arrays in injection molding, Microsystem Technologies. 2016:1-7.
18. Sharma H, Nguyen D, Chen A, Lew V, Khine M. Unconventional low-cost fabrication and patterning techniques for point of care diagnostics. Annals of biomedical engineering. 2011; 39(4):1313-27.
19. Wood M A. Colloidal lithography and current fabrication techniques producing in-plane nanotopography for biological applications, Journal of The Royal Society Interface. 2007; 4(12):1-17.
20. Ho C M B, Ng S H, Li K H H, Yoon Y-J, 3D printed microfluidics for biological applications. Lab on a Chip. 2015; 15(18):3627-37.
21. Hong B, Xue P, Wu Y, Bao J, Chuah Y J, Kang Y. A concentration gradient generator on a paper-based microfluidic chip coupled with cell culture microarray for high-throughput drug screening, Biomedical Microdevices. 2016; 18(1):1-8.
22. Yazdi A A, Poprna A, Wong W, Nguyen T, Pan Y, Xu J. 3D printing: an emerging tool for novel microfluidics and lab-on-a-chip applications, Microfluidics and Nanofluidics. 2016; 20(3):1-18.
23. Liao Monodisperse Droplets and Polymeric Microparticles, Advanced Materials Technologies. 2016; 1(1).
24. Keenan T M, Folch A. Biomolecular gradients in cell culture systems. Lab on a Chip. 2008; 8(1):34-57.
25. Reza A, Stephanie K, Alexander H, Bekir Y, Fariba G, Sara K, et al. 3D-printed microfluidic devices. Biofabrication. 2016; 8(2):022001.
26. Bhattacharjee N, Urrios A, Kang S, Folch A. The upcoming 3D-printing revolution in microfluidics. Lab on a Chip. 2016; 16(10):1720-42.
27. Sivashankar S, Sapsanis C, Buttner U, Salama K N. Flexible low-cost cardiovascular risk marker biosensor for point-of-care applications. Electron Lett. 2015; 51(22):1746-7.
28. Xia H, Wan S, Shu C, Chew Y. Chaotic micromixers using two-layer crossing channels to exhibit fast mixing at low Reynolds numbers. Lab on a Chip. 2005; 5(7):748-55.
29. Krynicki K, Green C D, Sawyer D W. Pressure and temperature dependence of self diffusion in water, Faraday Discussions of the Chemical Society. 1978; 66(0): 199-208.
30. Makamba H, Kim J H, Lim K, Park N, Hahn J H, Surface modification of poly(dimethylsiloxane) rnicrochannels. Electrophoresis. 2003; 24(21):3607-19.
31. Toepke M W, Beebe D J. PDMS absorption of small molecules and consequences in microfluidic applications. Lab on a Chip. 2006; 6(12):1484-6.
32. Buttner U, Sivashankar S, Agambayev S, Mashraei Y, Salama K N. Flash µ-Fluidics; A Rapid Prototyping Method For Fabricating Microfluidic Devices. RSC Advances, 2016.
33. Romoli L, Tantussi G, Dini G. Experimental approach to the laser machining of PMMA substrates for the fabrication of microfluidic devices. Optics and Lasers in Engineering. 2011; 49(3):419-27.
34. Shallan A I, Smejkal P, Corban M, Guijt R M, Breadmore M C. Cost-Effective Three-Dimensional Printing of Visibly Transparent Microchips within Minutes. Analytical Chemistry. 2014; 86(6):3124-30.
35. Chen R J, Shilpa 5, Srinivasu V P, Yang S M, Chu Y J, Liu C H, editors. Dynamically controllable concentration gradient generator for studying cellular response to chemical instigation. 2011 16th International Solid-State Sensors, Actuators and Microsystems Conference; 2011 5-9 Jun. 2011.
36. Nithya M, Siddhartha S, Tapobrata P, Sarit K D. A diffusion based long-range and steady chemical gradient generator on a microfluidic device for studying bacterial chemotaxis. Journal of Micromechanics and Microengineering. 2016; 26(3):035011.

37. Sivashankar S., Agambayev S., Buttner U., Salama K N. Characterization of Solid UV Curable 3D Printer Resins for Biological Applications, IEEE Nano Electro Mechanical Systems (NEMS) 2016; Matsushima, Japan2016.
38. Zhang H, Lohcharoenkal W, Sun J, Li X, Wang L, Wu N, et al. Microfluidic gradient device for studying mesothelial cell migration and the effect of chronic carbon nanotube exposure. Journal of micromechanics and microengineering: structures, devices, and systems. 2015; 25(7):075010.
39. Somaweera H, lbraguimov A, Pappas D. A review of chemical gradient systems for cell analysis. Analytica Ch mica Acta. 2016; 907:7-17.
40. E. K. Sackmann, A. L. Fulton, and D. J. Beebe, "The present and future role of microfluidics in biomedical research," *Nature*, vol. 507, pp. 181-189, 03/13/print 2014.
41. S. Sivashankar, C. Sapsanis, U. Buttner, and K. N. Salama, "Flexible low-cost cardiovascular risk marker biosensor for point-of-care applications," *Electronics Letters*, vol. 51, pp. 1746-1748, 2015.
42. S. L, Anna, "Droplets and Bubbles in Microfluidic Devices," *Annual Review of Fluid Mechanics*, vol. 48, pp, 285-309, 2016,
43. Y. Xia, J. Si, and Z, Li, "Fabrication techniques for microfluidic paper-based analytical devices and their applications for biological testing: A review," Biosensors and *Bioelectronics*, vol. 77, pp. 774-789, 2016.
44. T. He, C. Wang, T. Urisu, T. Nagahiro, R. Tero, and R. Xia, "The PDMS-based microfluidic channel fabricated by synchrotron radiation stimulated etching," *Optics Express*, vol. 18, pp. 9733-9738, 2010/04/26 2010.
45. S. Sivashankar, S. Agambayev, Y. Mashraei, E. Q. Li, S. T. Thoroddsen, and K. N. Salama, "A "twisted" microfluidic mixer suitable for a wide range of flow rate applications," *Biomicrofluidics*, vol. 10, p. 034120, 2016.
46. P. W. Leech, N. Wu, and Y. Zhu, "Application of dry film resist in the fabrication of microfluidic chips for droplet generation," *Journal of Micromechanics and Microengineering*, vol. 19, p. 065019, 2009.
47. D. J. Guckenberger, T. E. de Groot, A. M. D. Wan, D. J. Beebe, and E. W. K. Young, "Micromilling: a method for ultra-rapid prototyping of plastic microfluidic devices," *Lab on a Chip*, vol. 15, pp. 2364-2378, 2015.
48. Y. Mashraei, S. Sivashankar, U, Buttner, and K. N. Salama, "Integration of fractal biosensor in a digital microfluidic platform," in *SENSORS, 2015 IEEE*, 2015, pp. 1-4,
49. D. Conchouso, D. Castro, S. Khan, and I. G. Foulds, "Three-dimensional parallelization of microfluidic droplet generators for a litre per hour volume production of single emulsions," *Lab on a Chip*, vol. 14, pp. 3011-3020, 2014.
50. U, Buttner, S. Sivashankar, S. Agambayev, Y. Mashraei, and K. N, Salarna, "Flash [small mu]-fluidics: a rapid prototyping method for fabricating microfluidic, devices," *RSC Advances*, vol, 6, pp. 74822-74832, 2016,
51. C, M. B. Ho, S. H. Ng, K. H, H. Li, and Y. J. Yoon, "3D printed microfluidics for biological applications," *Lab on a Chip*, vol. 15, pp. 3627-3637, 2015.
52. M. Watanabe, "Microfluidic devices easily created using an office inkjet printer," *Micro fluidics and Nanofluidics*, vol. 8, pp. 403-408, 2010.
53. Sivashankar S., Agambayev S., Buttner U., and K. N. Salama, "Characterization of Solid UV Curable 3D Printer Resins for Biological Applications," presented at the IEEE Nano Electro Mechanical Systems (NEMS) 2016, Matsushima, Japan, 2016.
54. S. Sivashankar, S. Agambayev, K. Alamoudi, U. Buttner, N. M. Khashab, and K. N. Salama. (2016, Compatibility analysis of 3D printer resin for biological applications. *Micro & Nano Letters*. Available: http://digital-library.theiet.org/content/journals/10.1049/mnl.2016.0530

Therefore, the following is claimed:

1. A method of fabricating a microfluidic device, comprising the steps of:
  receiving a design pattern of the entire microfluidic device;
  providing a pair of surfaces, at least one of the surfaces formed of a light transmissive material;
  depositing a light sensitive material onto a surface of the pair of surfaces;
  placing another surface of the pair of surfaces in contact with the light sensitive material;
  providing a light source that is configured to generate a light pattern, which corresponds to the design pattern of the entire microfluidic device;
  positioning the pair of surfaces including the light sensitive material there between in relation to the light source to receive light projected therefrom;
  using the light source to project at once, the entire light pattern through the surface formed of the light transmissive material and to expose, without a mask, selected areas of the light sensitive material causing photo initiation of a reaction within the selected areas of the light sensitive material leaving certain undesired portions of the material soft, so that the design pattern of the entire microfluidic device is formed into the light sensitive material in only one exposure; and
  using pressurized air or vacuum to remove the undesired portions of the light sensitive material while each surface of the pair of surfaces remains in contact with desired portions of the light sensitive material, to form channels, which correspond to the design pattern, within the light sensitive material.

2. The method of claim 1, wherein the light sensitive material is selected from the group consisting of photo sensitive resins.

3. The method of claim 1, wherein the at least one surface formed of a light transmissive material is selected from the group of quartz, Pyrex, PMMA and other transparent polymers.

4. The method of claim 1, wherein the pair of surfaces comprise a pair of opposed, parallel flat surfaces.

5. The method of claim 4, wherein the flat surfaces are each formed of a glass slide.

6. The method of claim 4, wherein the surfaces are disposed apart a distance of from 10 micron to 500 micron or larger than 800 micron, depending on the viscosity of the photo sensitive resin.

7. The method of claim 1, wherein the light sensitive material is exposed for a period of 2 seconds to 20 seconds.

8. The method of claim 1, wherein the pressurized air has either a positive or a negative air pressure.

9. The method of claim 1, including the step of flushing the channels with a solvent.

10. The method of claim 9, wherein the solvent is selected from the group consisting of isopropyl alcohol, ethanol, methanol, alcohol, and chloroform.

11. A method of fabricating a microfluidic device, comprising the steps of:

forming holes in a top substrate;

depositing a light sensitive material on a bottom substrate, wherein the bottom substrate comprises a light transmissive material;

arranging the top substrate on the bottom substrate so that the light sensitive material is interposed between the top and bottom substrates;

projecting an entire light pattern at once, on the light sensitive material, via the bottom substrate to form in only one exposure, without a mask, a corresponding design pattern in the light sensitive material, wherein the light pattern corresponds to the design pattern, which describes the entire microfluidic device; and forming microfluidic channels by removing undesired portions of the light sensitive material while the top and bottom substrates remain in contact with desired portions of the light sensitive material.

12. The method of claim 11, further comprising:

attaching tubing supports to the holes in the top substrate; and attaching tubing to the tubing supports.

13. The method of claim 11, wherein the undesired portions of the light sensitive material are removed using a pressurized air or vacuum.

14. The method of claim 13, further comprising:

flushing the undesired portions of the light sensitive materials using a solvent.

15. The method of claim 11, further comprising:

aligning the holes in the top substrate with the light sensitive material.

16. A method of fabricating a microfluidic device, comprising the steps of:

applying a photocurable resin on a bottom substrate;

aligning a top substrate on the bottom substrate so that the photocurable resin is interposed between the top and bottom substrates;

exposing at once, without a mask, the light sensitive material to a light pattern to form a design pattern in the light sensitive material in only one exposure, to selectively cure portions of the light sensitive material corresponding to the light pattern, wherein the light pattern corresponds to the design pattern, which describes the entire microfluidic device; and flushing undesired portions of the light sensitive material, while the top and bottom substrates remain in contact with desired portions of the light sensitive material, to form microfluidic channels.

17. The method of claim 16, wherein the flushing of undesired portions involves pressurized air or a vacuum, as well as a solvent.

18. The method of claim 16, wherein the top substrate includes inlet and outlet holes, the method further comprising:

attaching tubing to the inlet and outlet holes.

19. The method of claim 18, wherein the inlet or outlet holes are formed by drilling into the top substrate.

20. The method of claim 16, further comprising:

applying an adhesion promoter that promotes adhesion of the light sensitive material to the top and bottom substrates.

* * * * *